United States Patent
Tegen et al.

(10) Patent No.: US 7,659,602 B2
(45) Date of Patent: Feb. 9, 2010

(54) SEMICONDUCTOR COMPONENT WITH MIM CAPACITOR

(75) Inventors: Stefan Tegen, Dresden (DE); Klaus Muemmler, Dresden (DE); Peter Baars, Dresden (DE); Odo Wunnicke, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 12/131,728

(22) Filed: Jun. 2, 2008

(65) Prior Publication Data

US 2009/0294907 A1    Dec. 3, 2009

(51) Int. Cl.
*H01L 49/00* (2006.01)
(52) U.S. Cl. .................. 257/535; 257/532; 257/499
(58) Field of Classification Search .......... 257/532, 257/306, 300, 309, E21.018, E21.019, E21.648; 438/396; 365/49.12, 149
See application file for complete search history.

(56) References Cited

U.S. PATENT DOCUMENTS

| | | | | |
|---|---|---|---|---|
| 4,855,953 A | * | 8/1989 | Tsukamoto et al. | 365/149 |
| 5,362,665 A | * | 11/1994 | Lu | 438/253 |
| 5,534,457 A | * | 7/1996 | Tseng et al. | 438/254 |
| 6,175,130 B1 | | 1/2001 | Hosotani et al. | |
| 6,853,024 B1 | * | 2/2005 | Tu | 257/301 |
| 2002/0105048 A1 | * | 8/2002 | Matsushita et al. | 257/506 |
| 2003/0203588 A1 | | 10/2003 | Song et al. | |
| 2004/0235260 A1 | | 11/2004 | Lee et al. | |

FOREIGN PATENT DOCUMENTS

KR    10-0418587    *  2/2004

OTHER PUBLICATIONS

Suzuki et al. "Linear-Supported Cylinder (LST) Technology to realize Ru/Ta2O5/Ru Capacitor for Future DRAMs", 2000, IEDM, pp. 793-796.*

* cited by examiner

*Primary Examiner*—Thomas L Dickey
*Assistant Examiner*—Nikolay Yushin
(74) *Attorney, Agent, or Firm*—Slater & Matsil, L.L.P.

(57) ABSTRACT

A structure and method of forming a capacitor is described. In one embodiment, the capacitor includes a cylindrical first electrode having an inner portion bounded by a bottom surface and an inner sidewall surface, the first electrode further having an outer sidewall, the first electrode being formed from a conductive material. An insulating fill material is disposed within the inner portion of the first electrode. A capacitor dielectric is disposed adjacent at least a portion of the outer sidewall of the first electrode. A second electrode is disposed adjacent the outer sidewall of the first electrode and separated therefrom by the capacitor dielectric. The second electrode is not formed within the inner portion of the first electrode.

29 Claims, 28 Drawing Sheets

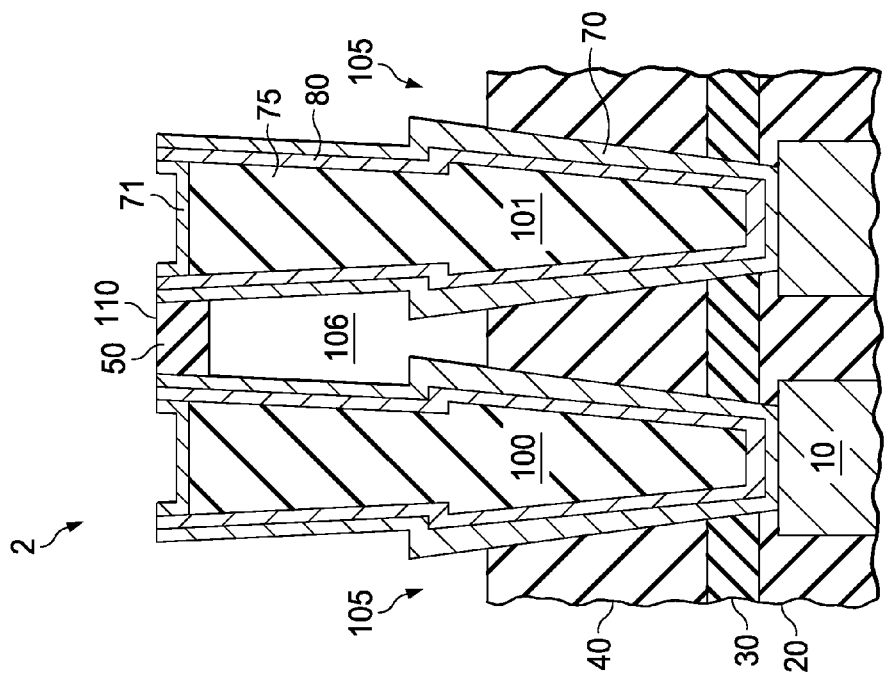
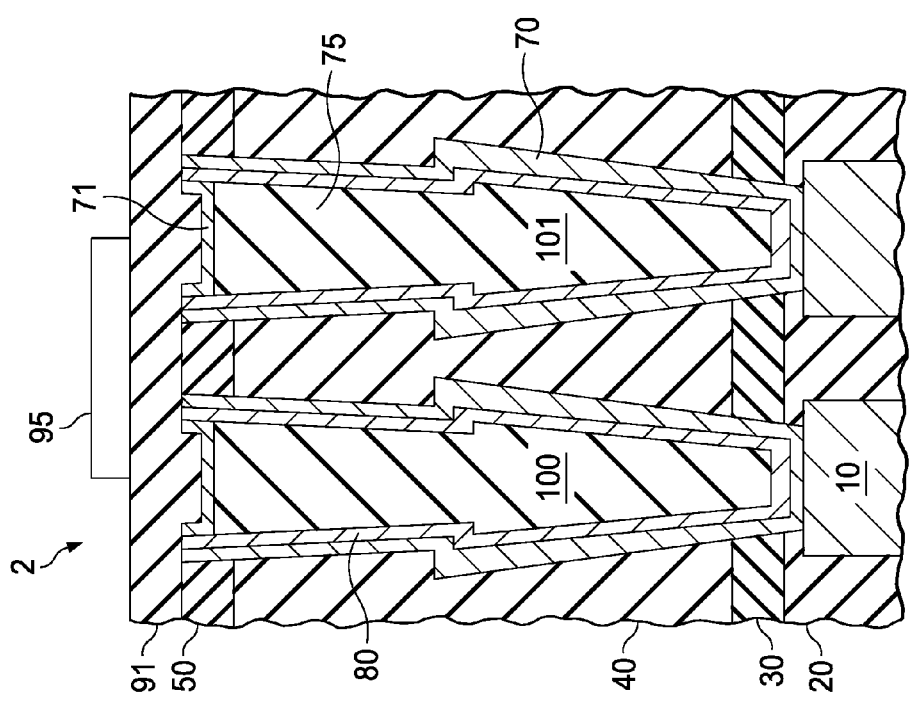

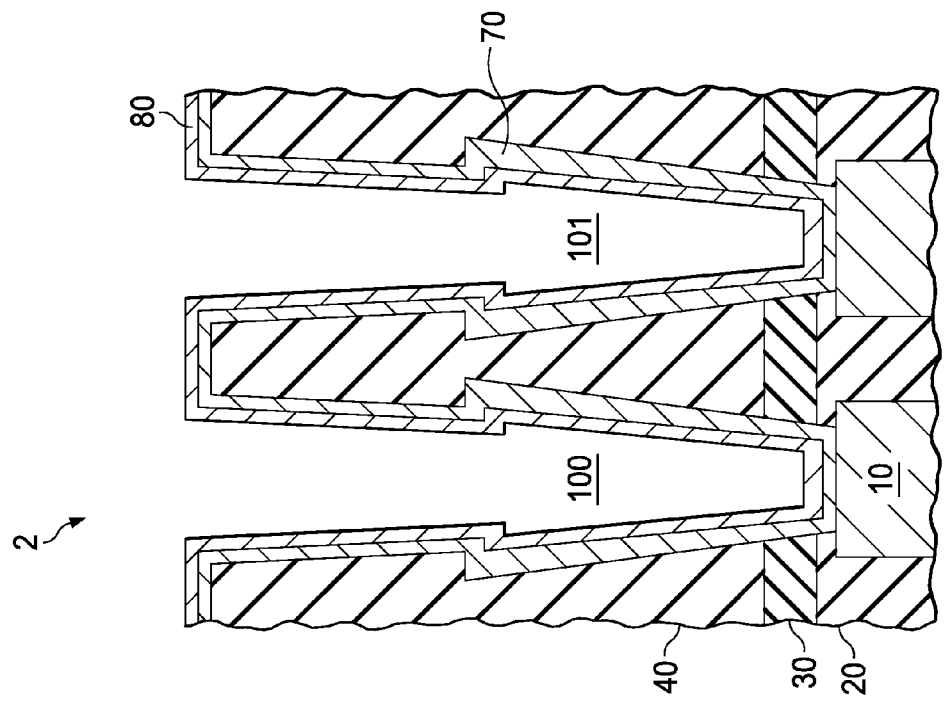
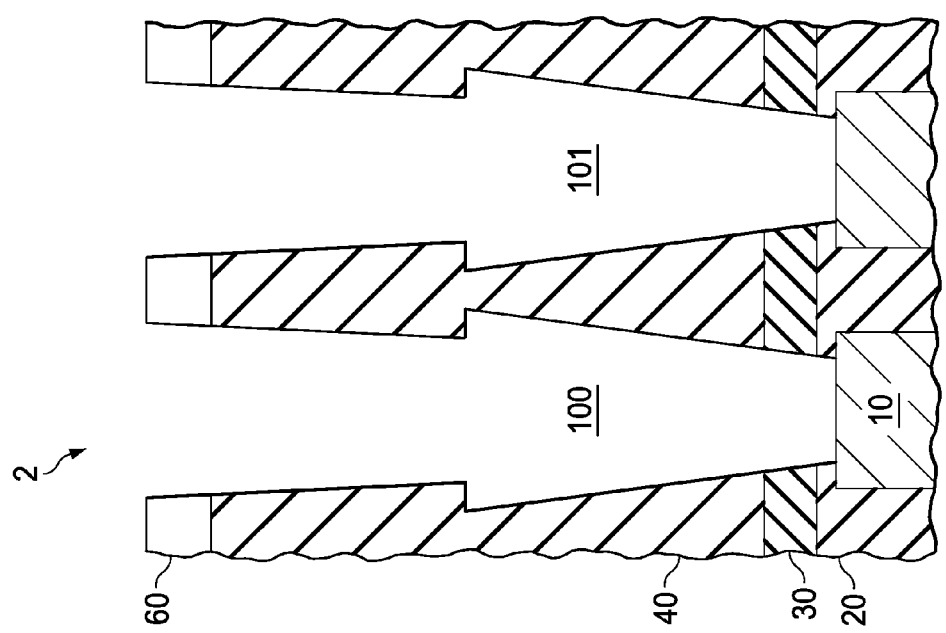
FIG. 5b
FIG. 5a

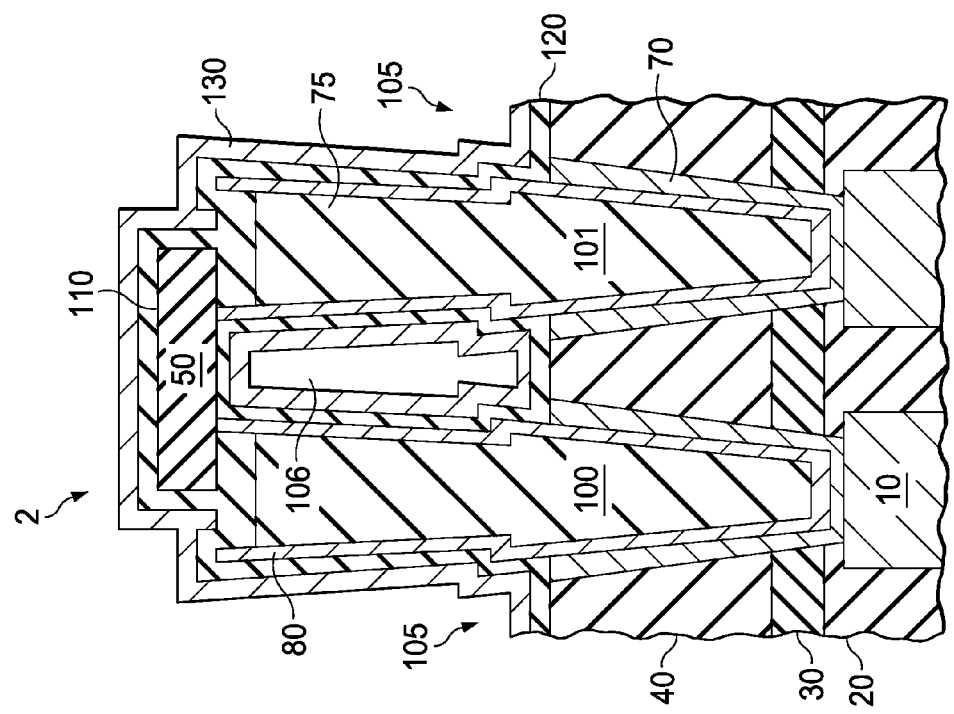
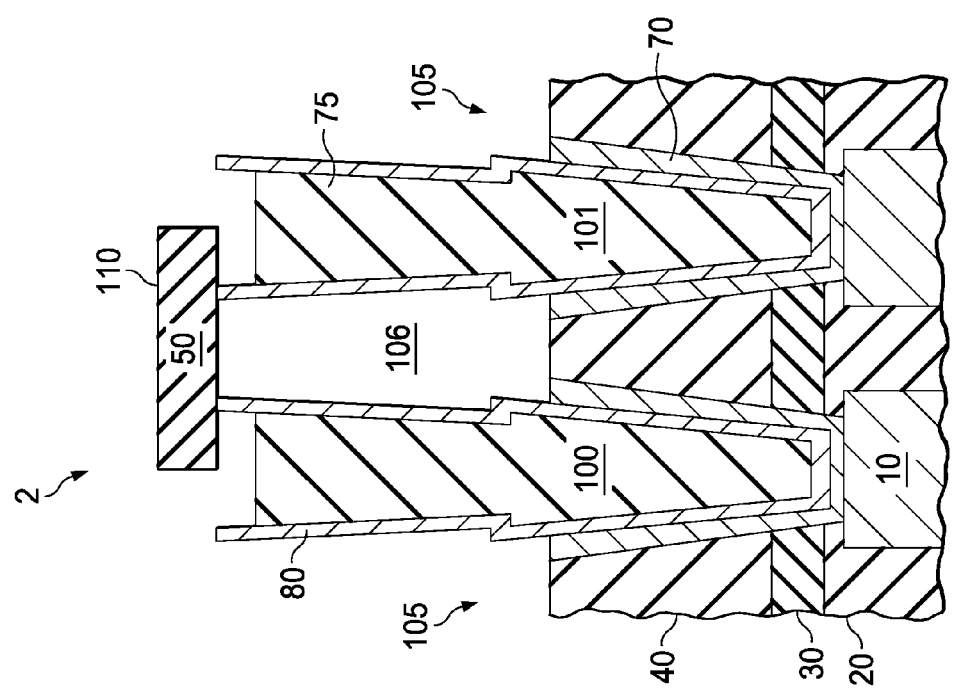

SEMICONDUCTOR COMPONENT WITH MIM CAPACITOR

TECHNICAL FIELD

This invention relates generally to electronic devices, and more particularly to a semiconductor component with MIM capacitor.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a trend in the semiconductor industry towards reducing the size of features, e.g., the circuits, and the devices in order to increase density of the semiconductor devices. Hence, the minimum feature size of semiconductor devices has steadily decreased over time. However, as features of semiconductor devices become smaller, it becomes difficult to form small features at required performance. One such challenge involves the fabrication of capacitors used in various applications. For example, the footprint of capacitors should be reduced without degrading the capacitance. This drives a need for new materials as well high aspect ratio features, all the while, without significantly increasing the cost of the device.

Hence, what are needed in the art are improved structures and methods for producing capacitors amenable to sustain scaling of the semiconductor industry.

SUMMARY OF THE INVENTION

These and other problems are generally solved or circumvented, and technical advantages are generally achieved, by embodiments of the present invention.

Embodiments of the invention include structures of capacitors and a method of making the capacitors. In accordance with an embodiment of the invention, the capacitor comprises a cylindrical first electrode having an inner portion bounded by a bottom surface and an inner sidewall surface, the first electrode further having an outer sidewall, the first electrode being formed from a conductive material, and a fill material disposed within the inner portion of the first electrode, the fill material comprising an insulating material. The capacitor further comprising a capacitor dielectric adjacent at least a portion of the outer sidewall of the first electrode. A second electrode is disposed adjacent the outer sidewall of the first electrode and separated therefrom by the capacitor dielectric, the second electrode not formed within the inner portion of the first electrode.

The foregoing has outlined rather broadly the features of an embodiment of the present invention in order that the detailed description of embodiments of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1a-1b, illustrates a stacked capacitor, wherein FIG. 1a illustrates a cross sectional and FIG. 1b illustrates a top view, in accordance with embodiments of the invention;

FIG. 2, which includes

FIG. 3, which includes FIGS. 3a-3h, illustrates a stacked capacitor in various stages of fabrication, in accordance with an embodiment of the invention;

FIG. 5, which includes FIGS. 5a-5k, illustrates a stacked capacitor in various stages of fabrication, wherein FIGS. 5a-5d, 5f-5h, and 5j-5k illustrate cross sections and FIGS. 5e and 5i illustrate top cross sections, in accordance with an embodiment of the invention;

FIG. 7, which includes

FIG. 9, which includes

FIG. 11, which includes

FIG. 13, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
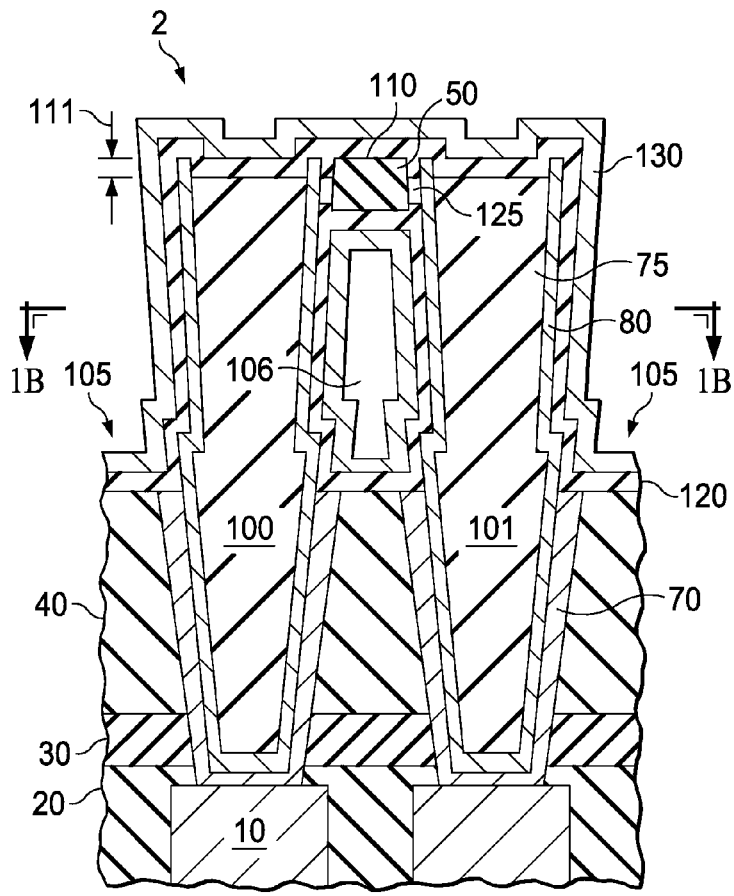

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely structures of capacitors, and methods of forming the capacitors. The invention may also be applied, however, to other types of semiconductor components, for example, other structures with openings or holes, for example, for other applications. One of ordinary skill in the art will be able to recognize further examples as well.

Technology scaling involves shrinking device geometries and hence the footprint of capacitors. Although shrinking cell geometries reduces the area of the capacitor, preferably the capacitance should not decrease in a new technology node. Consequently, a capacitor's capacitance per unit area is increased by increasing the dielectric constant of the capacitor dielectric, increasing the area, and/or decreasing the thickness of the dielectric.

Stacked capacitors are a class of capacitors fabricated above the semiconductor substrate comprising the active devices. Stacked capacitors typically include high aspect ratio cylinders, a first electrode lining an outer opening sidewall and a second electrode disposed inside an inner and an outer sidewall of the cylinder. Scaling these stacked capacitors results in an increase in the aspect ratio of the cylindrical structure. Any further increase in the height of the cylindrical structure to increase the capacitance increases the aspect ratio further. However, high aspect ratio structures pose significant challenges both during fabrication, and subsequently during product lifetime.

One way of manufacturing stacked capacitors involves forming an opening (e.g., cylindrical) in a mold material layer. The inner electrode is formed on the sidewalls of the opening, on the mold material layer. The inside of the opening is filled forming a cylindrical structure with a lining that includes the inner electrode. The mold oxide is next removed, to form the capacitor dielectric and outer electrode. However, such a fabrication process results in low process yields due to structural problems after the removal of the mold material layer.

Further, as the aspect ratio of the opening increases, the inside of the opening is not completely filled, leaving a void. A stacked capacitor with a void will also collapse from the inside. One way to minimize forming voids is to fill the opening using a spin-coating process. However, such processes fill the openings with porous materials that are easily etched or removed in fabrication, for example, during removal of the mold material layer.

In various embodiments, the invention overcomes all these problems using different structures and methods of manufacturing. For example, in one embodiment, a portion of the mold material layer is not removed, thus forming a support structure to the electrode. Similarly, in another embodiment the porous material filling the opening is covered by a sacrificial or permanent layer that protects the porous material from aggressive processing. In another embodiment, sacrificial support structures are formed over the openings for additional mechanical support during the manufacturing process. Different embodiments of the invention utilize one or more of these embodiments. Specific embodiments illustrating these concepts are described below.

A structural embodiment of the invention will be first described using FIG. 1. Various structural embodiments are next described with respect to FIG. 2. Various embodiments of the method of fabrication will then be described using FIGS. 3, 5, 7, 9, 11, and 13 and the flow charts of FIGS. 4, 6, 8, 10, and 12.

Figure 1B:
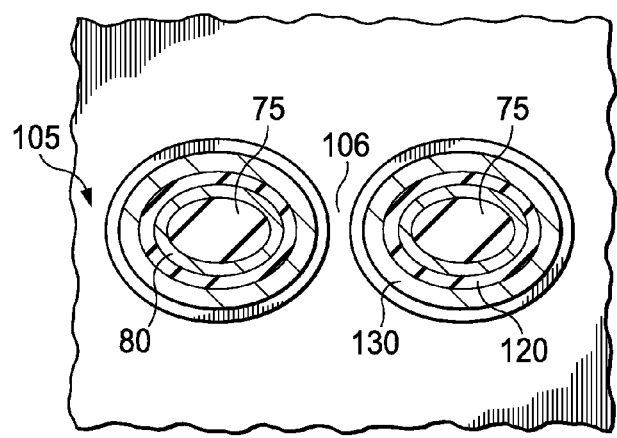

An embodiment of the invention is illustrated in FIG. 1, wherein FIG. 1a illustrates a cross sectional view and FIG. 1b illustrates a top view along a cross section (line 1b of FIG. 1a). The structure illustrated in FIG. 1 is an intermediate structure formed during the fabrication of a semiconductor component. FIG. 1 shows the structure of the capacitor after formation of the capacitor plates or electrodes, but before forming contacts.

Referring to FIG. 1a, a capacitor 2 is disposed above a semiconductor body (not shown). In various embodiments, the capacitor 2 comprises a stacked capacitor, for example, a DRAM capacitor. The capacitor semiconductor body comprises active devices and required isolation regions, and includes, for example, read/write transistors. The capacitor 2 comprises a first electrode layer 80 and a second electrode layer 130 separated by a capacitor dielectric layer 120. In various embodiments, the second electrode layer 130 and the capacitor dielectric layer 120 are disposed only on a part of the first electrode layer 80. For example, in one embodiment, less than around 70% of the exposed upper surface of the first electrode layer 80 is covered by the capacitor dielectric layer 120 and the second electrode layer 130. Thus, the lower surface of the first electrode layer 80 is supported by the surrounding an insulating layer 40 (e.g., a mold material layer).

The first electrode layer 80 of the capacitor is formed along first and second openings 100 and 101, and electrically couples with the read/write transistors disposed in the semiconductor body through electrode contacts 10. The electrode contacts 10 are disposed in a first insulating layer 20 comprising, for example, a first interlevel dielectric material. The first insulating layer 20 comprises an oxide or other suitable low-k dielectric material.

A second insulating layer 30 is disposed above the first insulating layer 20. The second insulating layer 30 is thinner than the first insulating layer 20 comprising, for example, a nitride. The third insulating layer 40 is disposed above the second insulating layer 30. The third insulating layer 40 comprises an interlevel dielectric material. In some embodiments, the third insulating layer 40 comprises more than a single layer. In an embodiment, the third insulating layer 40 comprises two layers, for example, a lower borophosphosilicate glass (BPSG) and an upper layer comprising an oxide layer such as tetra ethyl oxysilane (TEOS).

The first and second openings 100 and 101 are formed in the third insulating layer 40. In the illustrated embodiment, each of the first and second openings 100 and 101 comprises stacked truncated cones. Each of the first and second openings 100 and 101 comprises an upper truncated cone of a first dimension and a second bottom truncated cone of a second dimension. In this embodiment, the second dimension is larger than the first dimension so that the upper truncated cone transitions to the second bottom truncated cone with a change in the dimension of the first and second openings 100 and 101. However, in other embodiments, the first and second openings 100 and 101 may comprise a single cone. Also in some embodiments, the first and second openings 100 and 101 may comprise a different shape such as cylindrical, or pyramidal. The first and second openings 100 and 101 are high aspect ratio structures. In particular, the depth of the first and second openings 100 and 101 is preferably at least 20 times the cross sectional diameter of the first and second openings 100 and 101. The diameter of the first and second openings 100 and 101 is smaller than about 80 nm. In one embodiment, the height of the first and second openings 100 and 101 is about 500 nm to about 2000 nm.

Referring to FIG. 1a, the first and second openings 100 and 101 are lined with a first conductive liner 70, and the first conductive liner 70 contacts the electrode contacts 10 and is disposed under the first electrode layer 80. In one embodiment, the first electrode layer 80 comprises a noble metal. An example of the noble metal comprises ruthenium selected, for example, because of this high work function and inert qualities, or alternately, other metals with suitable properties. Suitable properties include electrical properties such as high work function, manufacturability (e.g., ease of uniform deposition with known processes such as ALD and etchability), as well as chemical properties (e.g., inert relative to other surrounding layers). In other embodiments, the first electrode layer 80 may comprise other metals and/or metal alloys and/or intermetallics. Examples include Hf, Ti, Ta, Ti, La, V, Nb, Pr, Dy, Sr, Gd, Mo, and their alloys. Examples of intermetallics include conductive materials formed with non-metallic materials such as nitrogen, oxygen, carbon, etc.

The first conductive liner 70 is disposed on the third insulating layer 40. In one embodiment, the first conductive liner 70 comprises a Ti/TiN layer. In various embodiments, the first conductive liner 70 comprises a material such as TiN, TaN, WN, etc. In various embodiments, the first conductive liner 70 comprises a thickness less than 100 nm.

A fill material 75 is disposed inside the first and second openings 100 and 101 and disposed on the first electrode layer 80. In various embodiments, the first electrode layer 80 completely or partially fills the first and second openings 100 and 101. In an embodiment, the fill material 75 partially fills the openings, forming a recess 111. The depth of the recess 111 may be as much as about a quarter times the depth of the first and second openings 100 and 101. The fill material is an insulating material, e.g., a spin on glass material comprising silicon oxide, although in some embodiments a conductive fill material may be used.

An inside trench cavity 106 is disposed between the first and second openings 100 and 101. A bridge 110 comprising a fourth insulating layer 50 is disposed between the first and second openings 100 and 101 and above the inside trench cavity 106. The fourth insulating layer 50 in different embodiments comprises a nitride layer. The bridge 110 helps in supporting the first and second openings 100 and 101 during processing and avoids forming structural defects. An outside trench cavity 105 is disposed around the first and second openings 100 and 101.

The capacitor dielectric layer 120 is disposed on the outer surfaces of the first electrode layer 80. The capacitor dielectric layer 120 is also disposed over the fill material 125. Consequently, the capacitor dielectric layer 120 is disposed along the exposed surfaces of the first and second openings 100 and 101 along the outer and inside trench cavities 105 and 106. The capacitor dielectric layer 120 is not disposed over the lower portion of the first and second openings 100 and 101. The capacitor dielectric layer 120 comprises a high-k dielectric material such as $SrTiO_3$, $BaSrTiO_3$, $Ta_2O_5$, $HfO_2$, $AlO_2$, or other high-k dielectric materials optimized to minimize parasitic leakage mechanisms while maintaining a high capacitance. The capacitor dielectric layer 120 may also comprise nano-laminates or combinations of multiple dielectric layers, wherein each layer is selected to optimize a particular characteristic.

The second electrode layer 130 is disposed on the capacitor dielectric layer 120. Hence, the second electrode layer 130 is not disposed on the lower portions of the first and second openings 100 and 101. The second electrode layer 130 comprises a metallic layer. In various embodiments, the second electrode layer 130 comprises a noble metal. In one embodiment, the second electrode layer 130 comprises ruthenium, aluminum, doped silicon or polysilicon, or alternately other metals with suitable properties.

FIG. 1b illustrates a top cross section, and illustrates the capacitor 2 structure comprising the first electrode layer 80 formed on the fill material 75, the capacitor dielectric layer 120 formed over the first electrode layer 80, and the second electrode layer 130 disposed on the capacitor dielectric layer 120. Although illustrated as circular, in other embodiments, the first electrode layer 80 comprises other suitable shapes, for example, rectangular, elliptical, etc. Similarly, in various embodiments, the first electrode layer 80 is formed in a wave like pattern to increase the area density of the capacitor plate.

The embodiment described in FIG. 1 (and FIG. 2) is illustrated during the fabrication of a semiconductor component. Hence, in the final structure, the outside and inside trench cavities 105 and 106 are replaced with suitable materials. For example, at least part of the outside and inside trench cavities 105 and 106 is replaced with conductive materials that contact the second electrode layer 130.

Figure 2A:
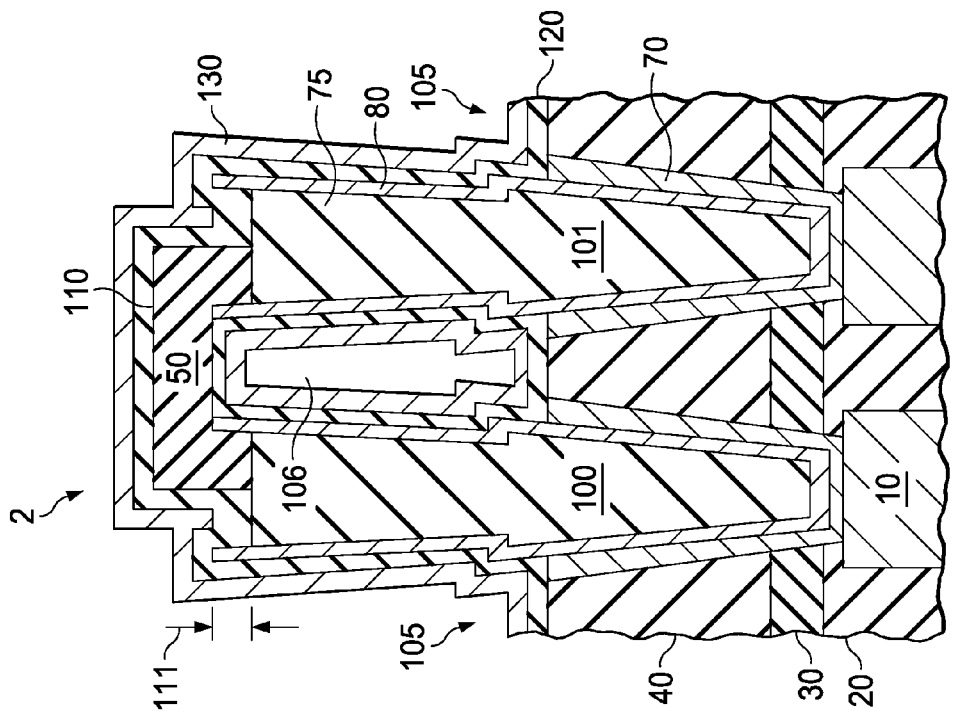
FIGS. 2a-2b, illustrates a stacked capacitor, in accordance with embodiments of the invention.
Figure 2B:
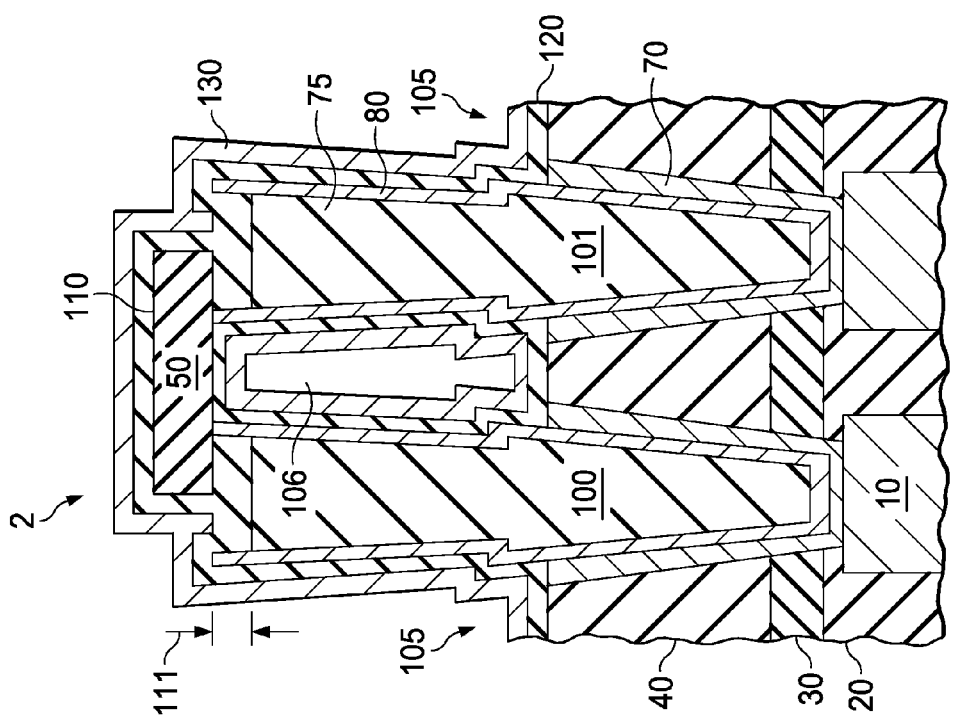

FIG. 2 describes structural embodiments of the invention. FIG. 2a illustrates an embodiment wherein the bridge 110 is disposed above the first and second openings 100 and 101. Consequently, the capacitor dielectric layer 120 fills the recess 111 formed between the bridge 110 and the fill material 75. As noted above, in various embodiments, the fill material 75 may comprise either an insulating material such as an oxide or a conductive material. FIG. 2b illustrates an embodiment in which the first and second openings 100 and 101 are filled with an etch resistant fill material 76. The recess 111 is partially filled with the bridge 110 structure forming a better support structure.

Figure 3B:
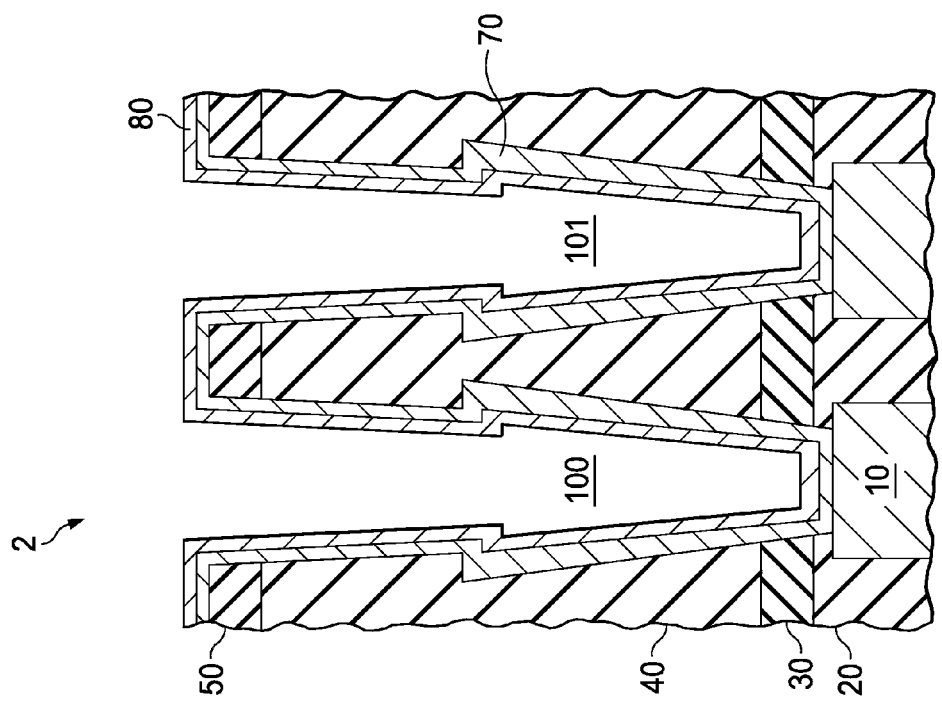
Figure 3A:
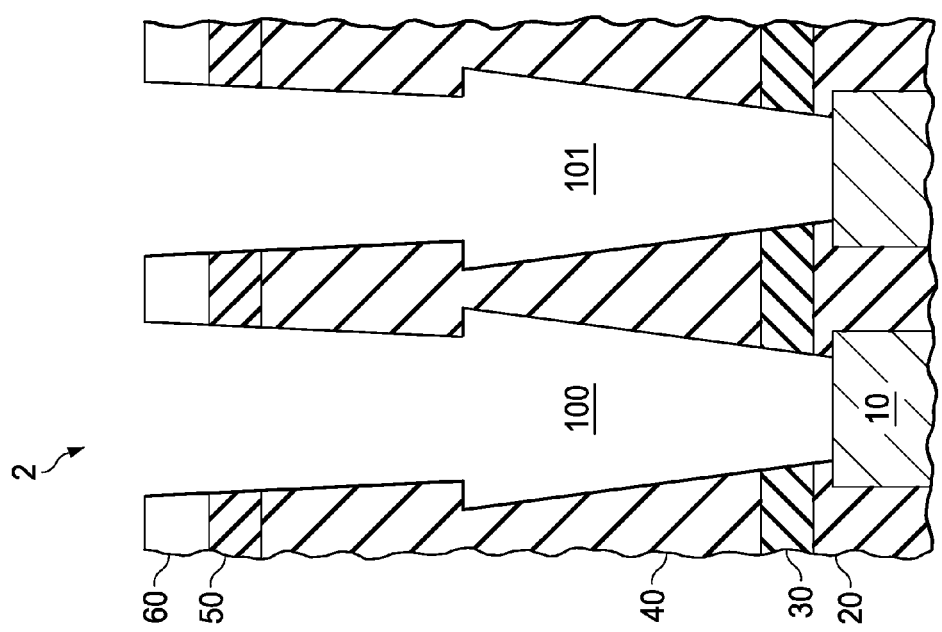
Figure 3C:
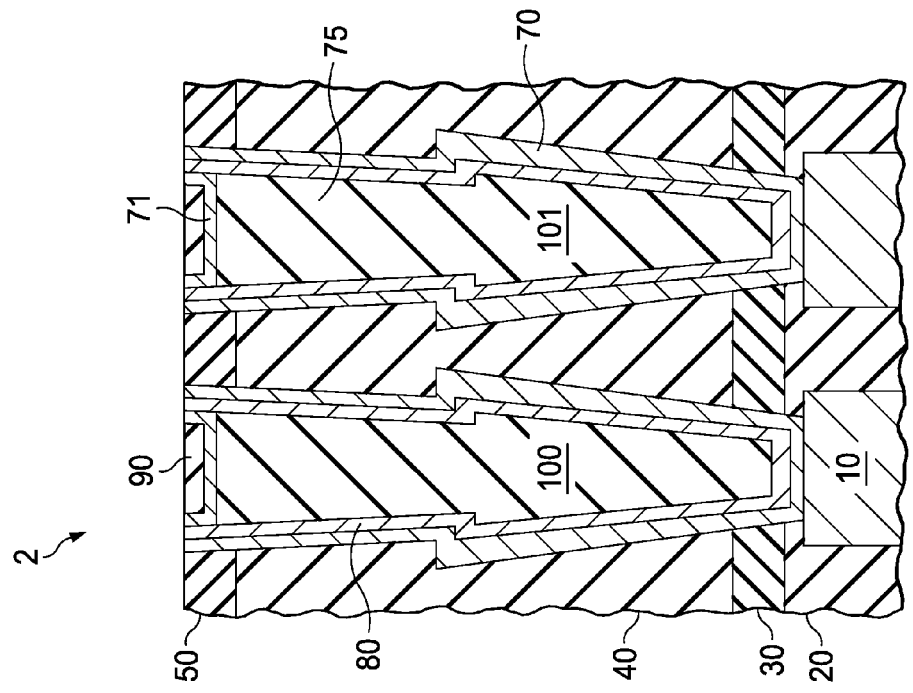
Figure 3D:
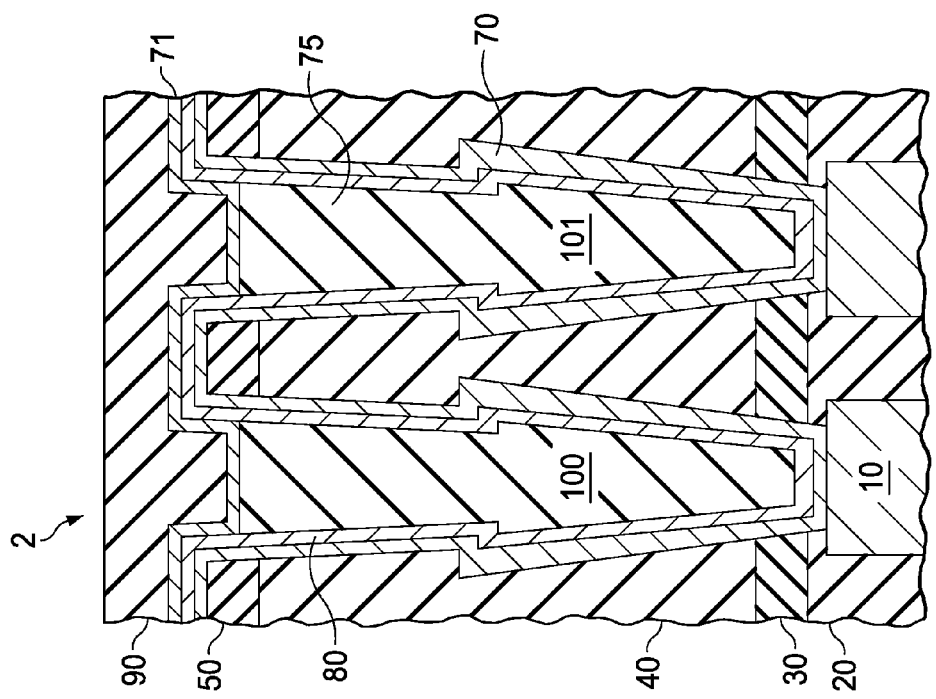
Figure 3H:
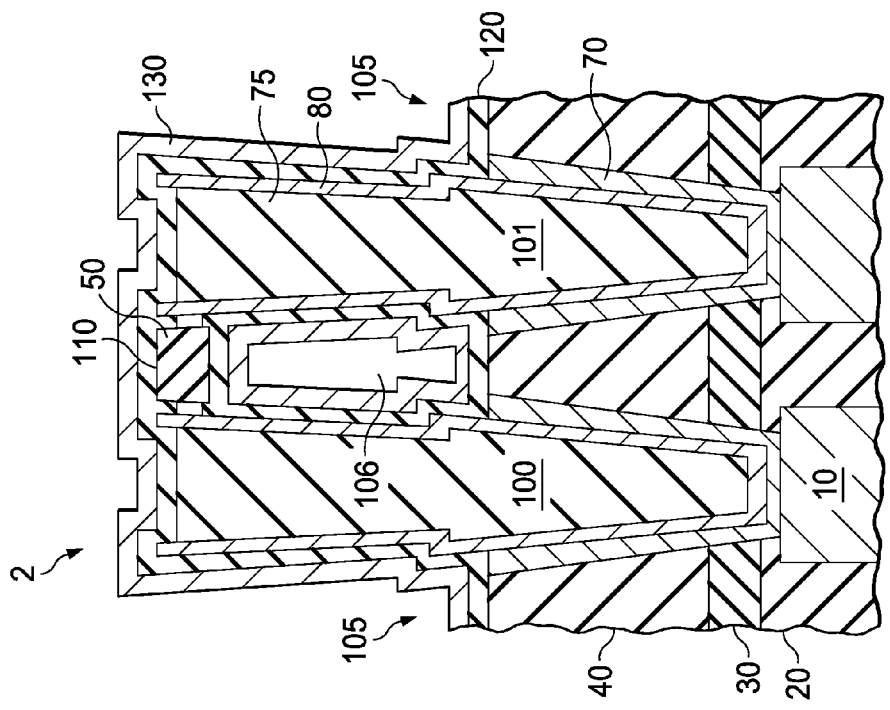
Figure 3G:
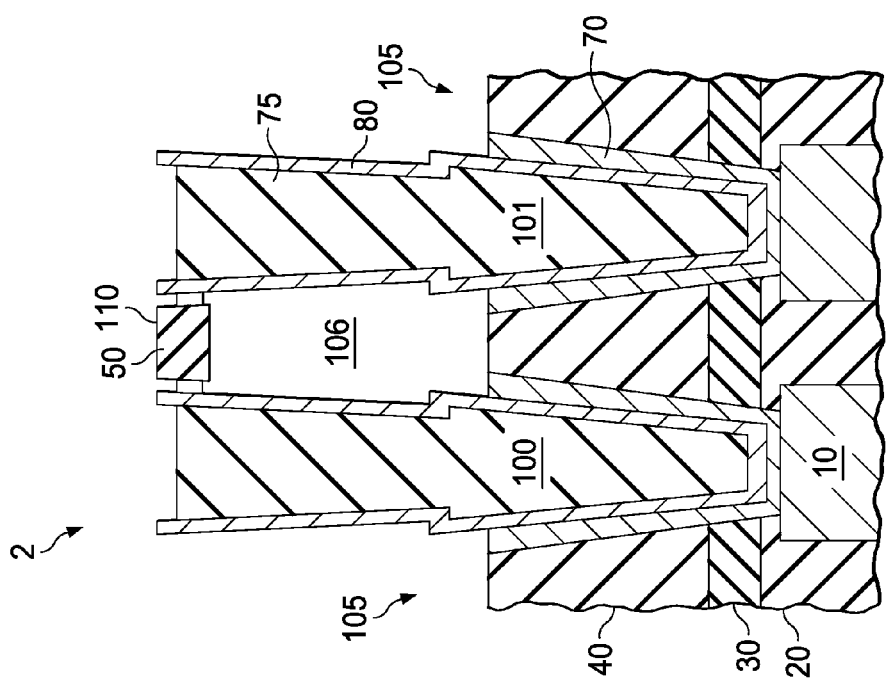
Figure 4:
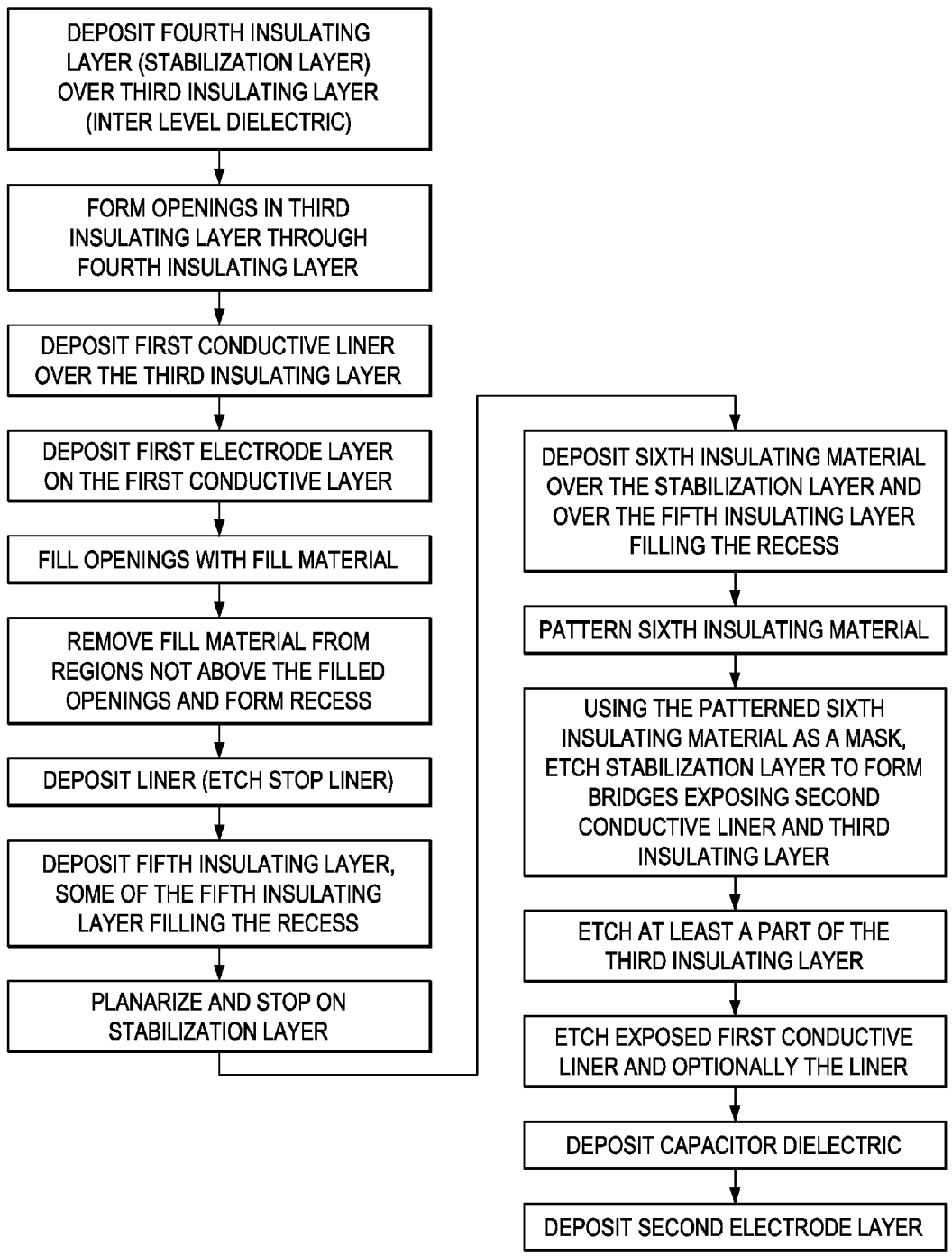
FIG. 4 illustrates a flow chart of a fabrication process used in manufacturing as illustrated in FIG. 3, in accordance with an embodiment of the invention.

FIG. 3, which includes FIGS. 3a-3h, along with the flow chart of FIG. 4, illustrates a method of forming the capacitor, in accordance with an embodiment of the invention. In FIG. 3, the capacitor 2 areas are disposed above a semiconductor body.

In one embodiment, the semiconductor body (not shown) comprises active devices such as transistors. The active devices are connected using metallization disposed above the semiconductor body. The semiconductor body also comprises necessary isolation regions such a trench isolation to electrically isolate different devices.

Referring to FIG. 3a, a wafer undergoes the front end of the line processing to form the active devices. The method disclosed here starts in the back end of the line process. A first insulating layer 20 is deposited during the back end of the line process. In different embodiments, the first insulating layer 20 is an interlevel dielectric layer, for example, present in the first level of metallization. However, in other embodiments, the first insulating layer 20 refers to an interlevel dielectric formed in a higher metal level. The first insulating layer 20 comprises an oxide or other suitable low-k dielectric material.

Electrode contacts 10 are formed in the first insulating layer 20. The electrode contacts 10 electrically couple with the select transistors disposed in the semiconductor body (not shown) through electrode contacts 10. The electrode contacts 10 can comprise any structure underneath the capacitor, for example, only a portion of the electrode contacts 10 may be conducting in some embodiments. A second insulating layer 30 is deposited on the first insulating layer 20. The second insulating layer 30 is typically an etch stop liner and is thinner than the first insulating layer 20. In various embodiments the second insulating layer 30 comprises, for example, a nitride deposited using a HCD (Hexachlorodisilane SiN) process. In other embodiments, the nitride comprises other nitrides such as RTCVD nitride, or DCS nitride.

A third insulating layer 40 is deposited above the second insulating layer 30. The third insulating layer 40 comprises an interlevel dielectric material. In some embodiments, the third insulating layer 40 is deposited as multiple layers. In another embodiment, a first layer is deposited followed by the deposition of a second layer. For example, the first layer comprises borophosphosilicate glass (BPSG) and the second layer comprises an oxide layer such as one deposited using tetra ethyl oxysilane (TEOS) as a precursor. A fourth insulating layer 50 is deposited on the third insulating layer 40. The fourth insulating layer 50 is also the stabilization layer comprising, for example, a nitride material.

As illustrated in FIG. 3*a*, first and second openings 100 and 101 are formed in the third insulating layer 40 and the fourth insulating layer 50. Using lithography techniques, the first mask layer 60 is patterned. In various embodiments, the first mask layer 60 comprises a carbon containing hard mask. Using the patterned first mask layer 60, the first and second openings 100 and 101 are etched, for example, using a reaction ion etch. If the third insulating layer 40 comprises two layers, the changes in the etch rate result in widening of the openings on the interface between the first and second layers. In the illustrated embodiment, the lower layer etches faster, and hence a widening of the openings is observed. This may be advantageous while etching openings with deep aspect ratios. After the etching of the third insulating layer 40, the underlying etch stop liner (second insulating layer 30) is also removed, for example, using a wet etch.

Referring next to FIG. 3*b*, the first and second openings are lined with a first conductive liner 70 and a first electrode layer 80. The first conductive liner 70 comprises, for example, a Ti/TiN layer deposited using a CVD process. The first conductive liner 70 is deposited uniformly over the bottom surface and the sidewalls of the first and second openings 100 and 101. The first conductive liner 70 may comprise a seed layer or a diffusion barrier layer for the first electrode layer. In various embodiments, the first conductive liner 70 comprises a thickness of about 1 nm to about 50 nm. However, in some embodiments, the first conductive liner 70 may not be deposited, and this step is skipped over.

A first electrode layer 80 is deposited over the first conductive liner 70. The first electrode layer 80 is deposited using an atomic layer deposition process (ALD), although in some embodiments, other deposition processes may be used. In various embodiments, the first electrode layer comprises a thickness of about 2.5 nm to about 50 nm. In one embodiment, the first electrode layer 80 comprises ruthenium. Alternately, other metals with suitably high work function may be deposited. In other embodiments the first electrode layer 80 may comprise other metals and/or metal alloys and/or intermetallics. Examples include Hf, Ti, Ta, Ti, La, V, Nb, Pr, Dy, Sr, Gd, Mo, and their alloys. Examples of intermetallics include conductive materials formed with non-metallic materials such as nitrogen, oxygen, carbon, etc.

Referring next to FIG. 3*c*, a fill material 75 is deposited into the first and second openings 100 and 101. In one embodiment, the fill material 75 is spin-coated using a spin on glass. The use of the SOG process enables filling of high aspect openings, as the spin on glass is coated in a liquid form (e.g., dissolved in a solvent). Examples of spin on glass include phosphosilicates and siloxanes. An optional curing (e.g., anneal) is performed to form the fill material 75. In another embodiment, the fill material 75 is filled using a process such as CVD.

The fill material 75 is planarized and recessed. The recess is formed, for example, by wet etching after the planarization of the deposited fill material 75. The time of wet etch is controlled to define the recess depth. A liner 71 is deposited over the recessed fill material 75 and over the planarized surface. The liner 71 is deposited using a CVD process and in one embodiment comprises Ti/TiN. In some embodiments, the liner 71 comprises materials that act as suitable etch stops during subsequent processing. The thickness of the liner 71 comprises about 2 nm to about 50 nm.

A fifth insulating layer 90 is deposited over the liner 71 such that the recess 111 is filled with the fifth insulating layer 90. The fifth insulating layer 90 comprises, for example, an oxide material. A planarization step follows the deposition of the fifth insulating layer 90 (FIG. 3*d*). Sixth insulating layer 91 and second mask layer 95 are deposited followed by patterning of a second mask layer 95 (FIG. 3*e*). Using the patterned second mask layer 95 as a mask, the underlying sixth insulating layer 91 is etched followed by removal of exposed fourth insulating layer 50.

The exposed third insulating layer 40 is next etched. The third insulating layer 40 is etched partially, although in some embodiments it may be etched completely. The partial etch is used so that the remaining third insulating layer 40 supports the first electrode layer 80. The liner 71 protects the underlying fill material 75 (especially if fill material 75 comprises spin on glass materials that are softer and etch rapidly) during the aggressive etching used to remove the exposed third insulating layer 40. The etching of the third insulating layer 40 forms the outside and inside trench cavities 105 and 106. In various embodiments, the partial etching removes the third insulating layer 40 to a depth of about 25% of the height of the first electrode layer 80 (or height of first or second opening 100 or 101) to about 75% of the height of the first electrode layer 80.

The exposed first conductive liner 70 and liner 71 are removed using, for example, a wet etch, as illustrated in FIG. 3*g*. The thickness of the fourth insulating layer 50 was selected during the earlier deposition process, such that the first conductive liner 70 is much thinner than the fourth insulating layer 50. Consequently, during the wet etch process the first conductive liner 70 disposed between fourth insulating layer 50 and the first electrode layer 80 is not removed in a central part, thus holding the bridge 110. The bridge 110 in turn supports the first electrode layer 80 and prevents it from collapsing or any other mechanical instability. The removal of the liner 71 is optional in some embodiments.

Referring next to FIG. 3*h*, the capacitor dielectric layer 120 and the second electrode layer 130 are next deposited. The capacitor dielectric layer 120 is deposited using, for example, an atomic layer deposition process. The capacitor dielectric layer 120 in various embodiments comprises a high-k dielectric material such as $SrTiO_3$, $BaSrTiO_3$, $Ta_2O_5$, $HfO_2$, $AlO_2$, or other high-k dielectric materials optimized to minimize parasitic leakage mechanisms while maintaining a high capacitance. The capacitor dielectric layer 120 in some embodiments is deposited in cycles. For example, if a dual material dielectric layer is used, the capacitor dielectric layer 120 is deposited by first depositing an atomic layer of a first material, followed by an atomic layer of a second material. The atomic layers of the first and second material are repeated to form the desired nano-laminate. Due to the high uniformity achievable by the ALD process, the capacitor dielectric layer 120 is also deposited along the inside trench cavity 106. In various embodiments, the physical thickness of the capacitor dielectric layer 120 varies from about 5 nm to about 15 nm, while the equivalent oxide thickness of the capacitor dielectric layer 120 varies from about 0.1 nm to about 2 nm.

The second electrode layer 130 is deposited over the capacitor dielectric layer 120, using, for example, an atomic layer deposition process. The second electrode layer 130 similarly, deposits uniformly over the capacitor dielectric layer 120. In one embodiment, the second electrode layer 130 comprises a noble metal. However, any metal that can be deposited uniformly either using ALD or with another manufacturable process may be used in some embodiments. In various embodiments, the physical thickness of the second electrode layer 130 varies from about 5 nm to about 40 nm.

Figure 5C:
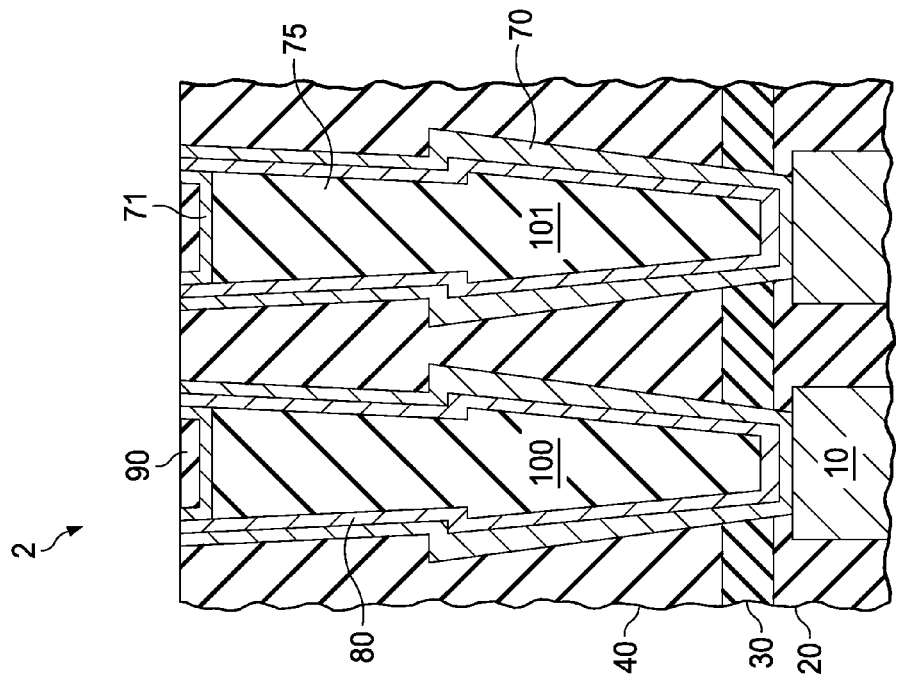
Figure 5D:
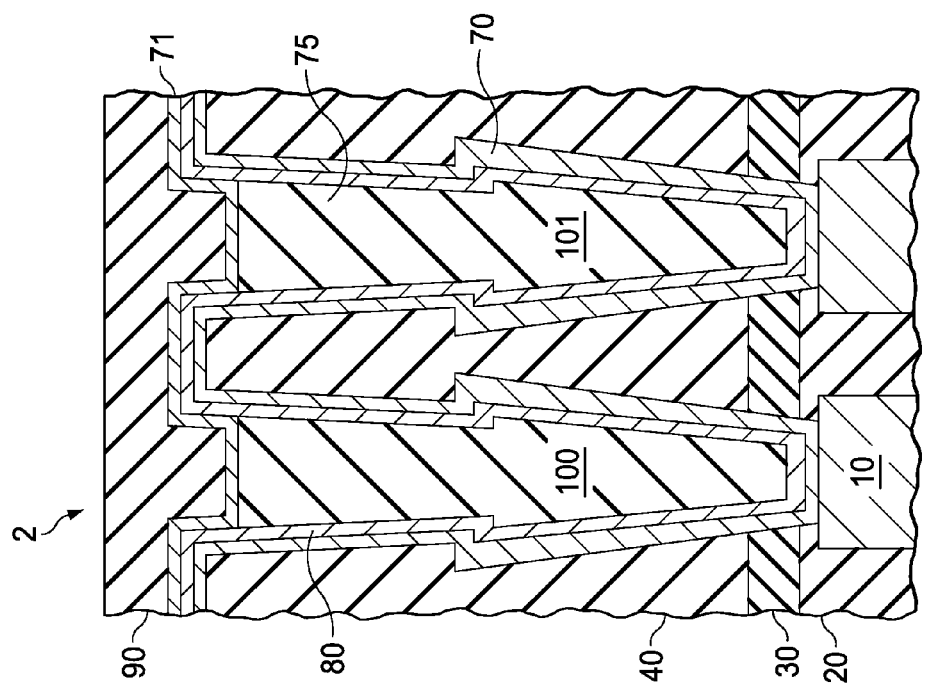
Figure 5E:
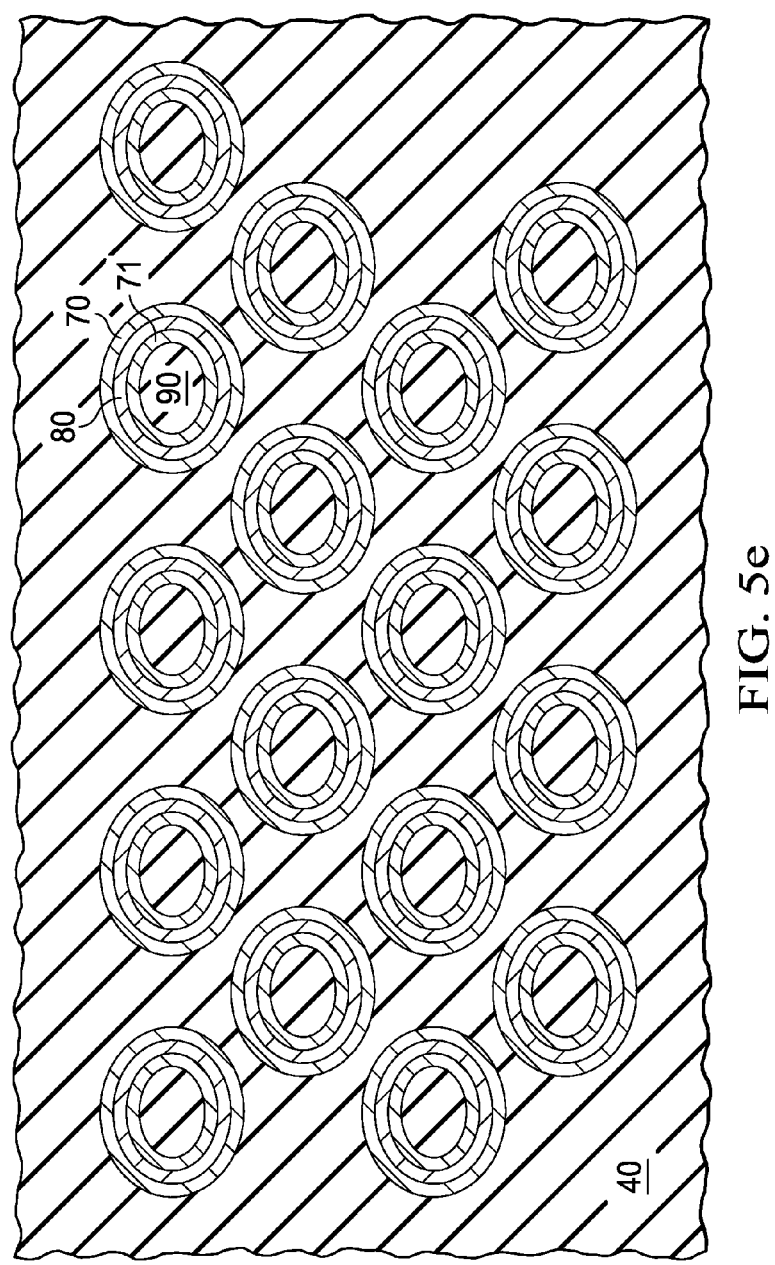
Figure 5F:
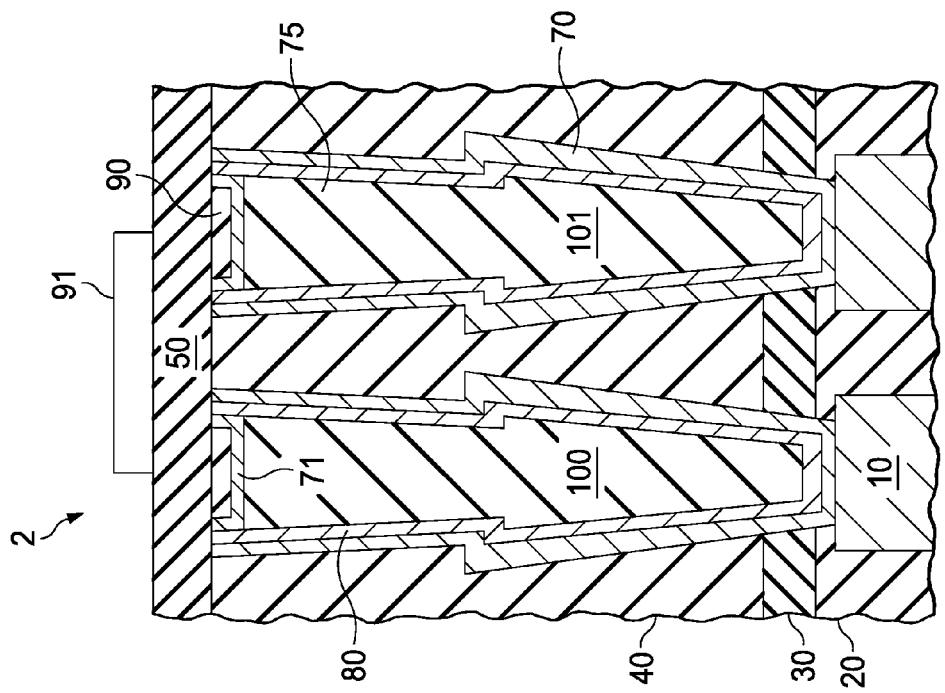
Figure 5G:
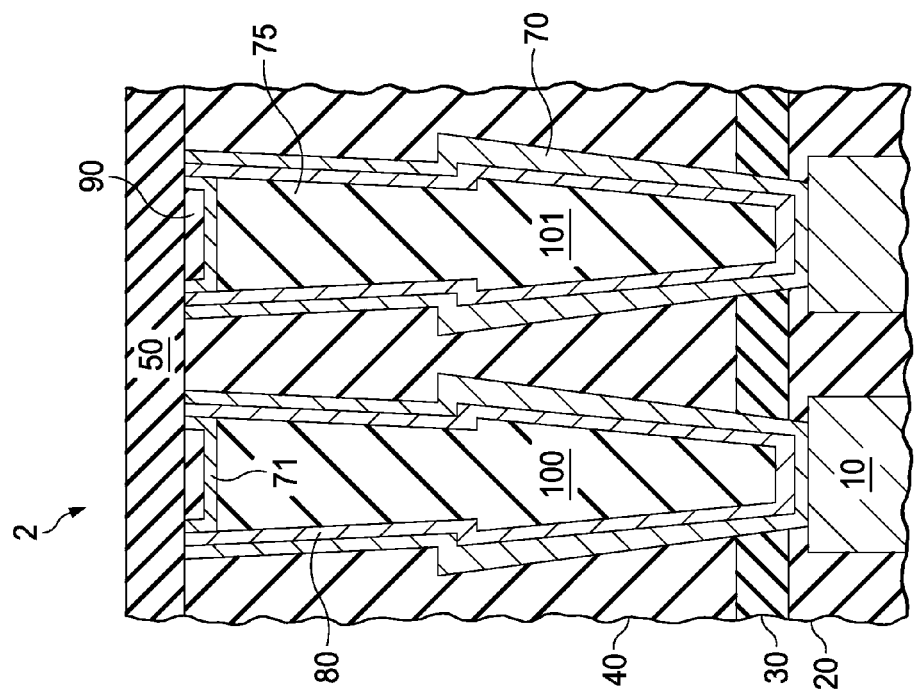
Figure 5H:
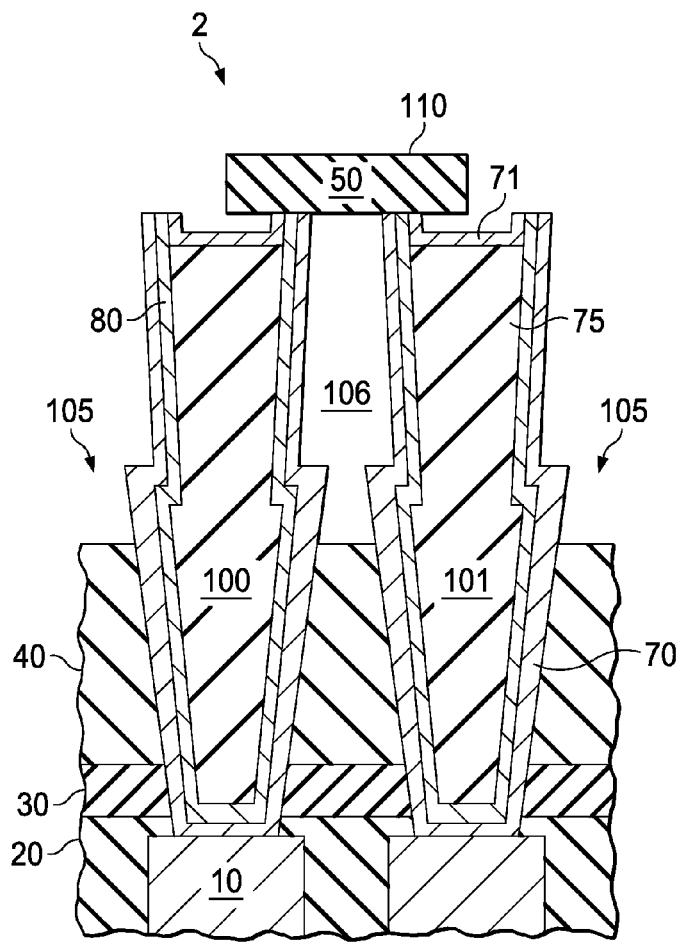
Figure 5I:
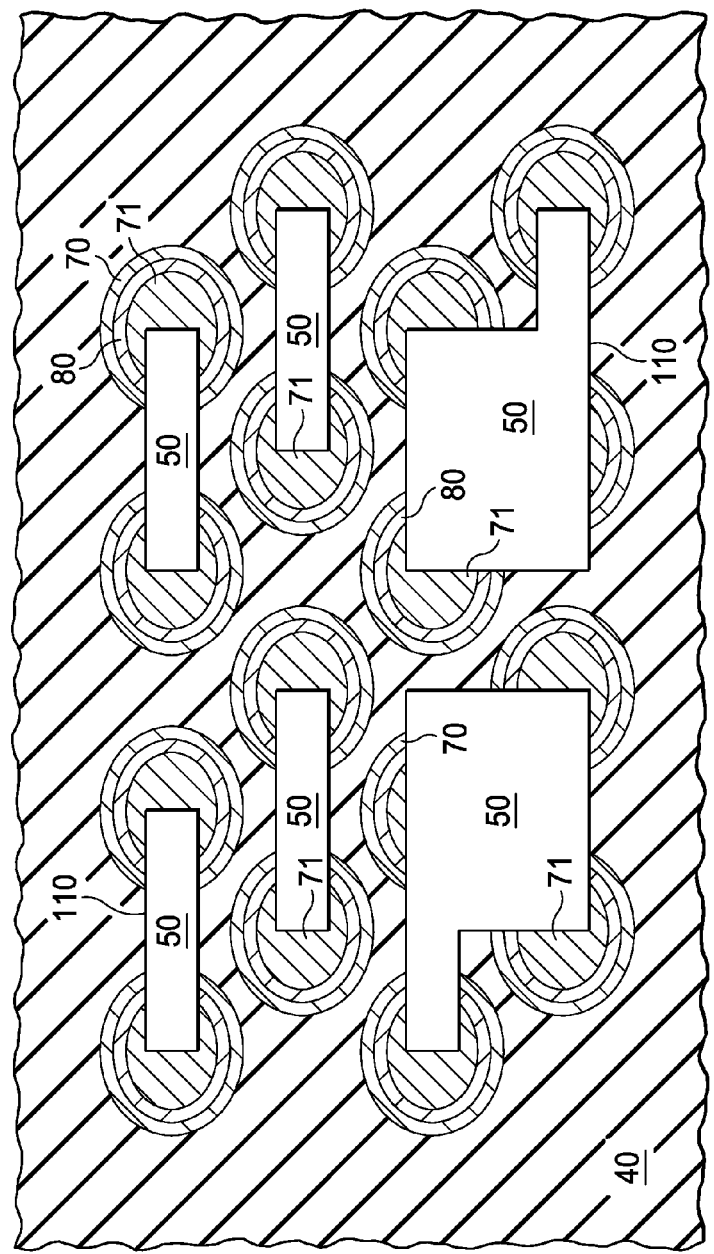
Figure 6:
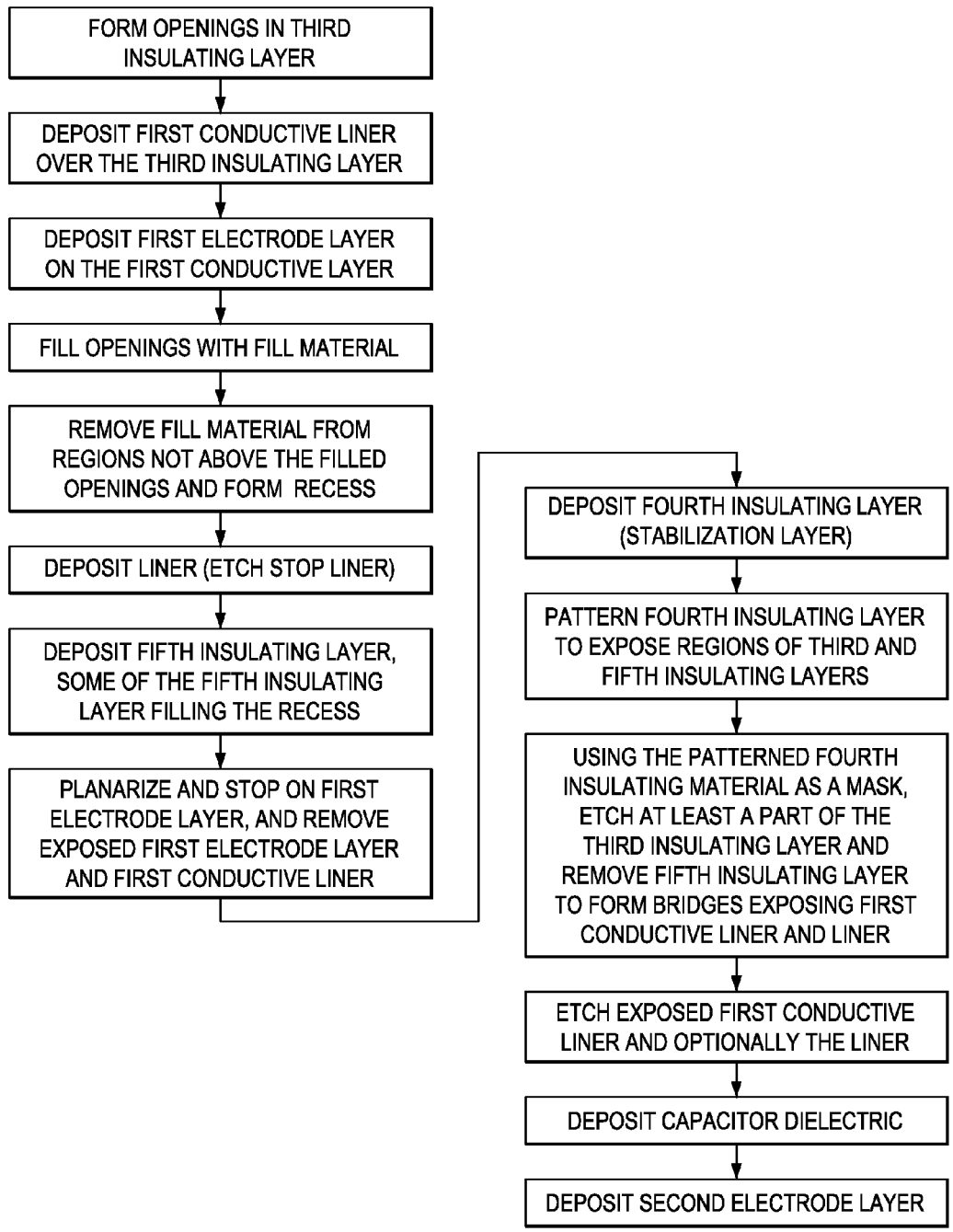
FIG. 6 illustrates a flow chart of a fabrication process used in manufacturing as illustrated in FIG. 5, in accordance with an embodiment of the invention.

FIG. 5 along with the flow chart of FIG. 6, illustrates a method of forming the structures, in accordance with an embodiment of the invention. As in FIG. 3, FIG. 5 illustrates the capacitor 2 areas which comprise the relevant features.

Referring first to FIG. 5a, the first and second openings 100 and 101 are formed. In this embodiment, as described with respect to FIG. 3a, the first insulating layer 20, electrode contacts 10, and third insulating layer 30 are formed. However, instead of depositing the fourth insulating layer 50, a first mask layer 60 is deposited. In various embodiments, the first mask layer 60 comprises a carbon containing hard mask. Using the patterned first mask layer 60, the first and second openings 100 and 101 are etched using, for example, a reaction ion etch.

As illustrated in FIGS. 5b-5d, the first conductive liner 70 is deposited followed by deposition of first electrode layer 80 (FIG. 5b). The first and second openings 100 and 101 are filled with fill material 75 and recessed (FIG. 5c). A fifth insulating layer 90 is deposited followed by planarization (FIG. 5d). FIGS. 5b-5d follow the same process steps as described in detail with respect FIGS. 3b-3d. A top cross section of the structure illustrated in FIG. 5d is illustrated in FIG. 5e. FIG. 5e illustrates the filled first and second openings 100 and 101 as well other openings embedded in the third insulating layer 40.

Referring next to FIG. 5f, a fourth insulating layer 50 is deposited. A sixth insulating layer 91 is deposited and patterned. The fourth insulating layer 50 is patterned using, for example, the patterned sixth insulating layer 91 (FIG. 5g). Patterning the fourth insulating layer 50 exposes regions of the fourth insulating layer 50 and the fifth insulating layer 90. The exposed regions of the fourth insulating layer 50 and the fifth insulating layer 90 are etched to form bridges 110 (support structures) (FIGS. 5h and 5i). The bridges are stabilization structures that support the underlying structure from collapsing.

Referring next to FIGS. 5j and 5k, the exposed first conductive liner 70 is etched, and the capacitor dielectric layer 120 and the second electrode layer 130 are deposited. These processes are described in FIGS. 3g and 3h.

Figure 7A:
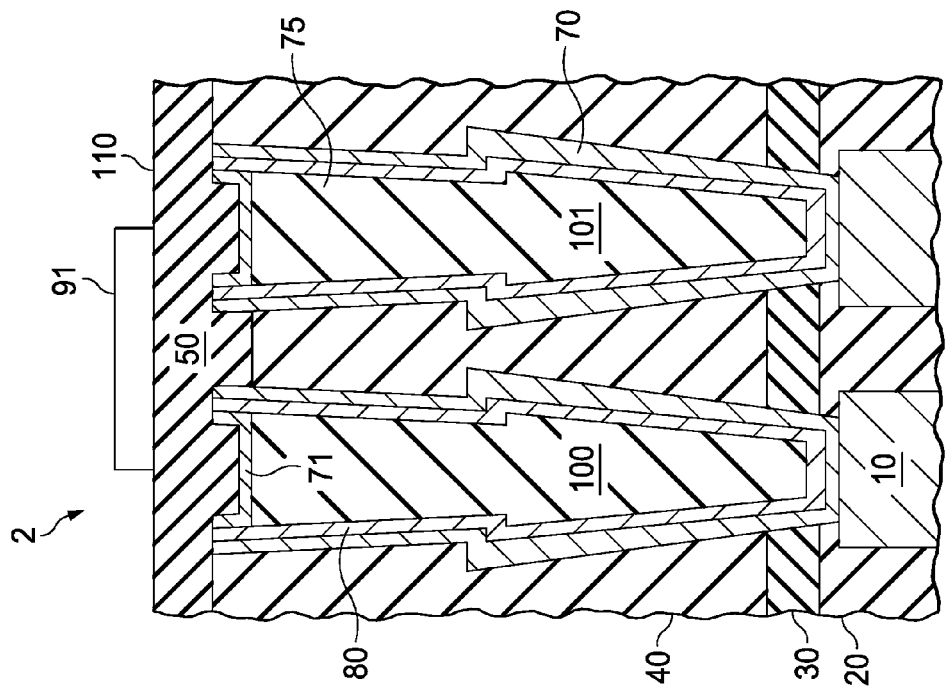
FIGS. 7a-7e, illustrates a stacked capacitor in various stages of fabrication, in accordance with an embodiment of the invention.
Figure 7B:
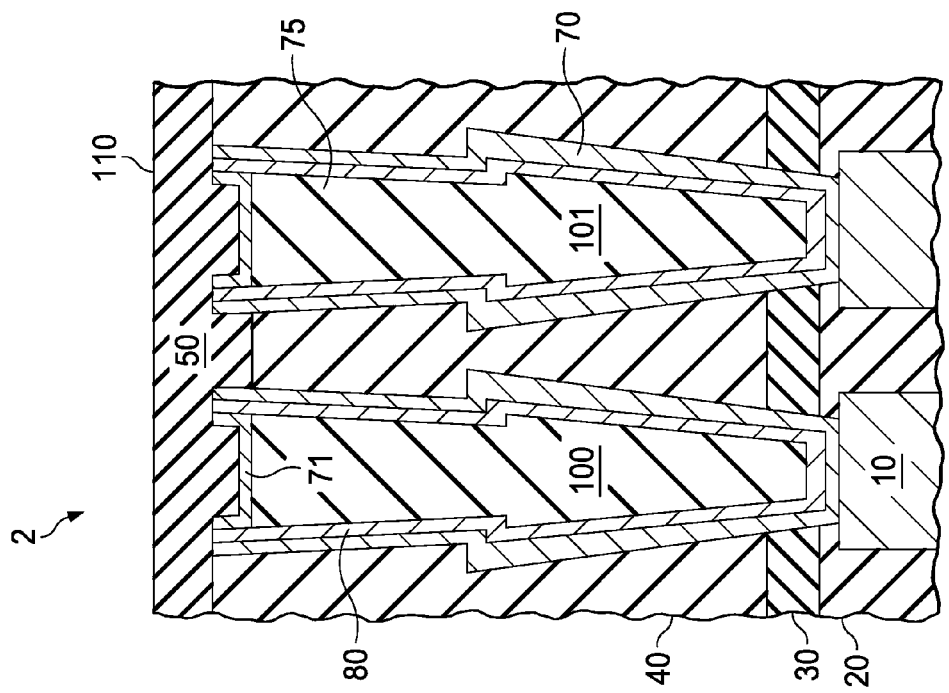
Figure 7C:
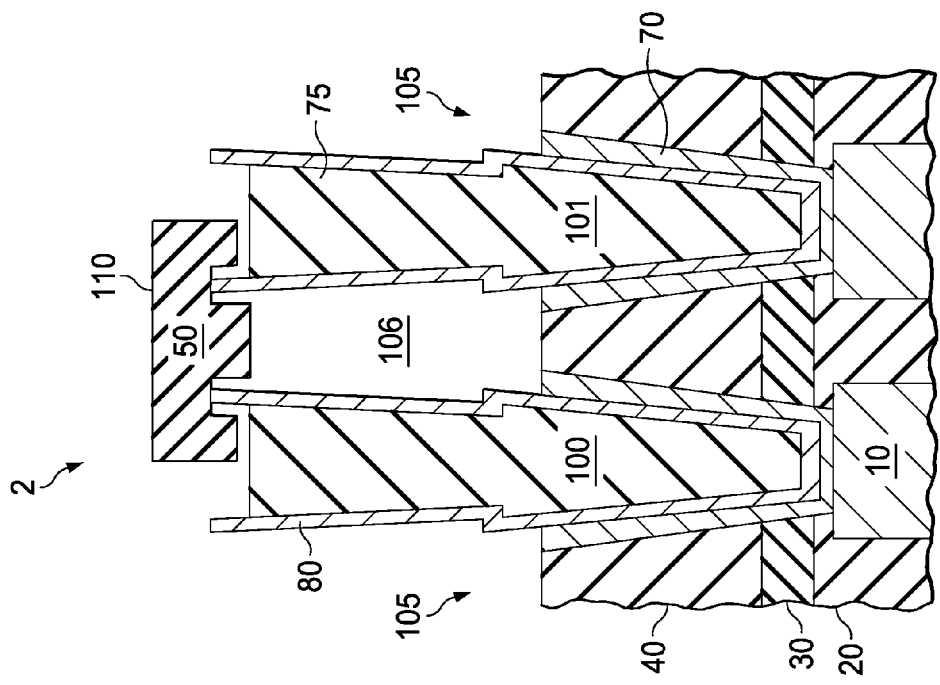
Figure 7D:
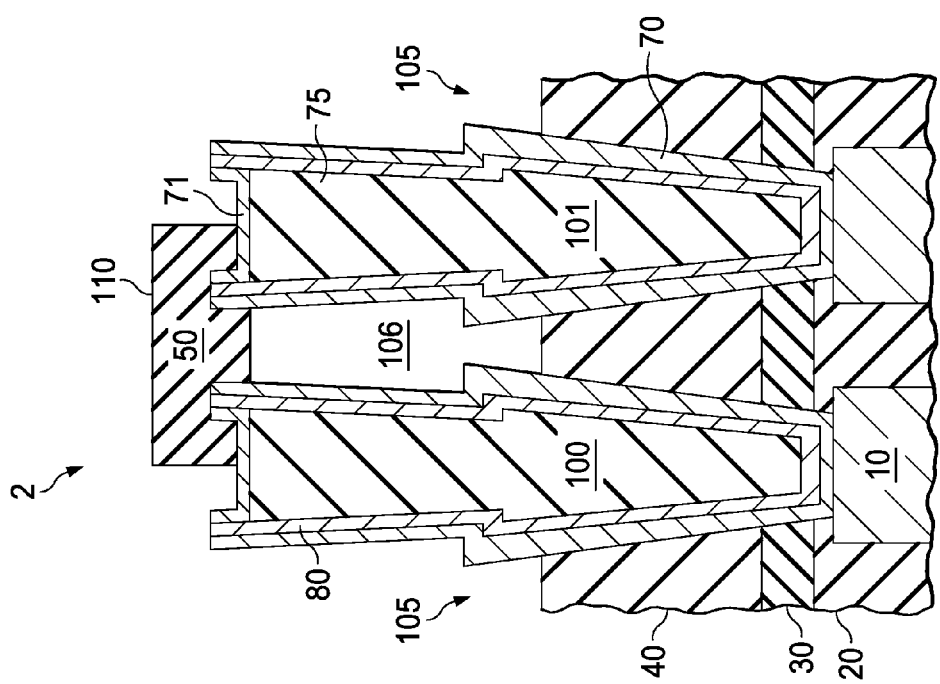
Figure 7E:
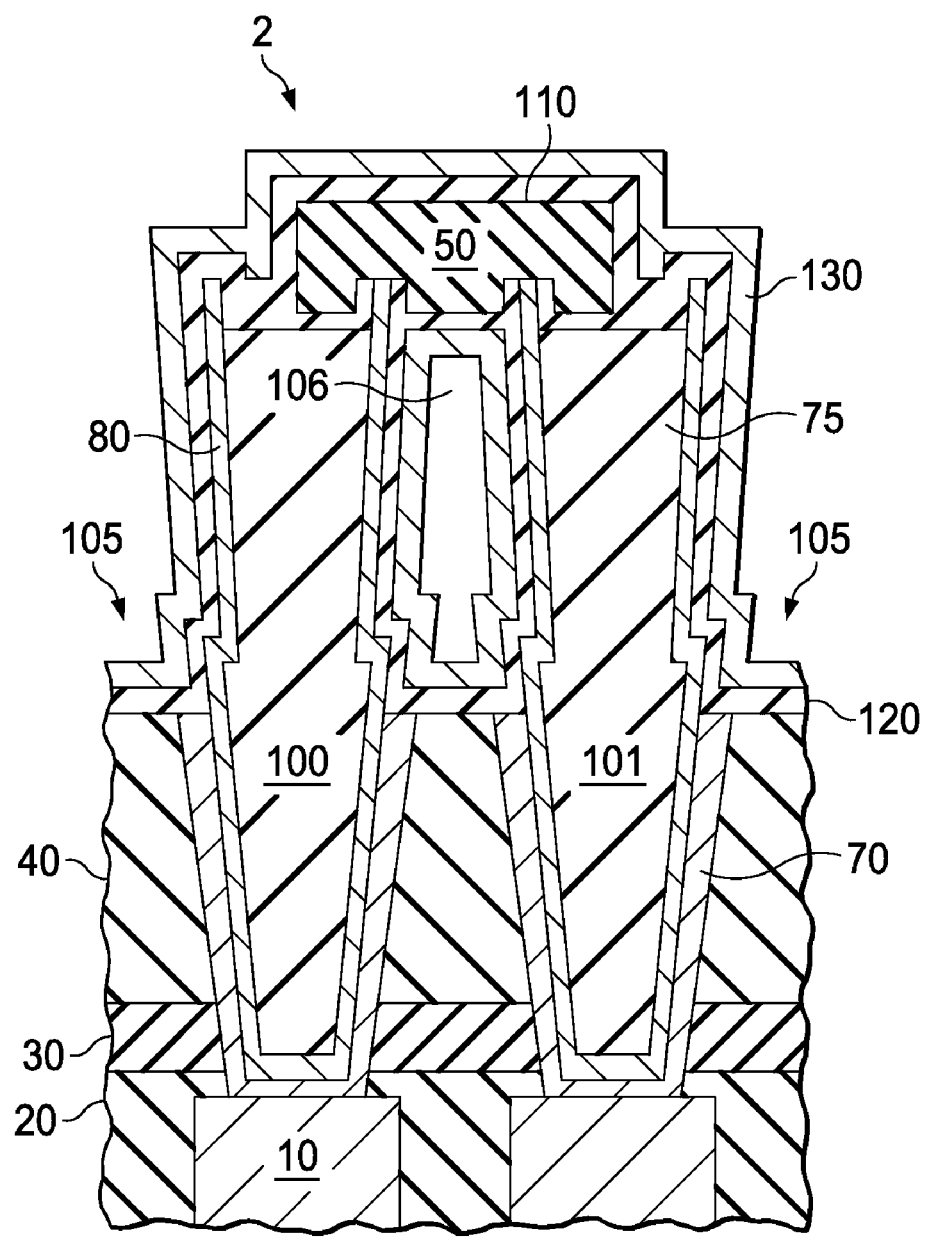
Figure 8:
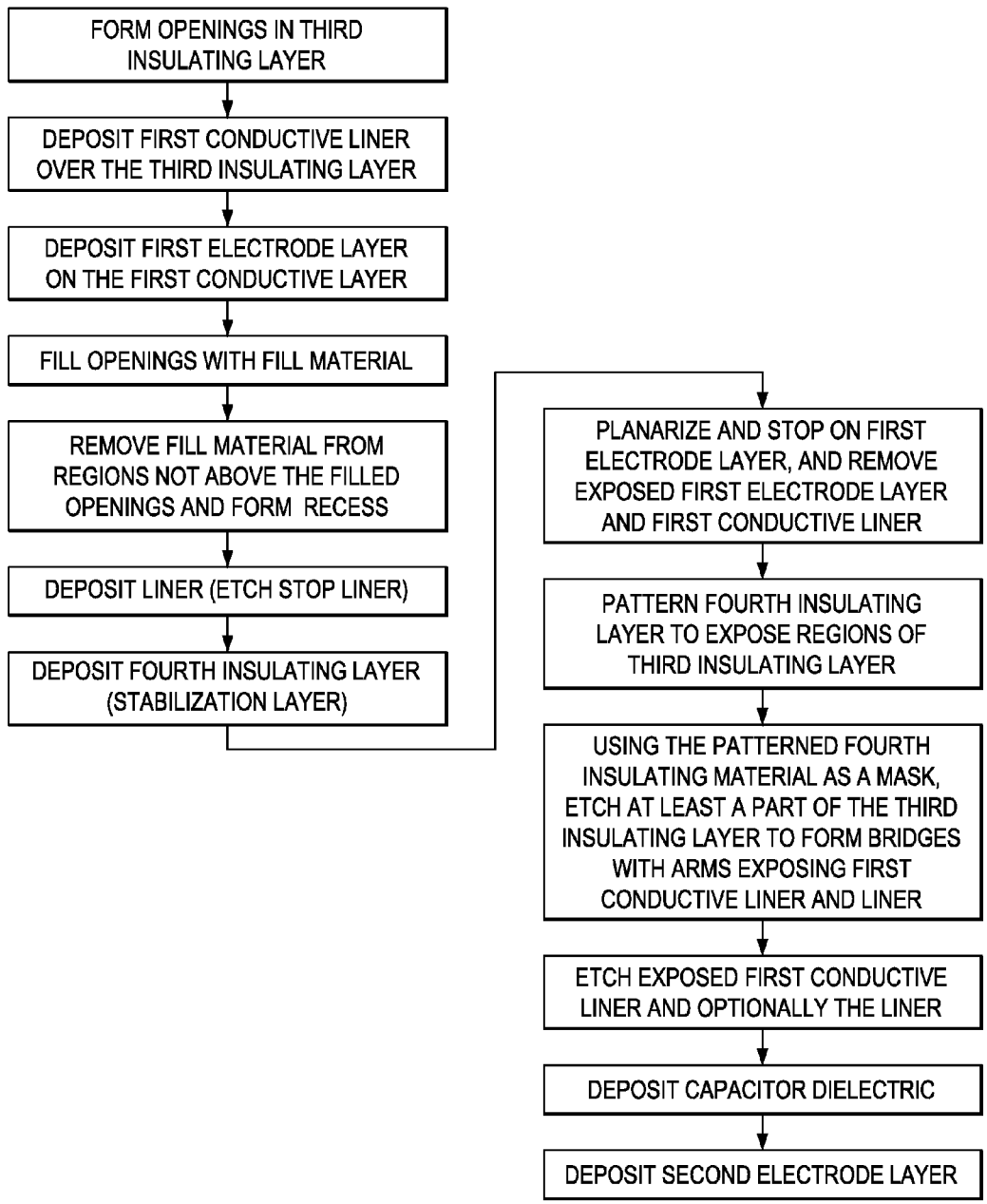
FIG. 8 illustrates a flow chart of a fabrication process used in manufacturing as illustrated in FIG. 7, in accordance with an embodiment of the invention.

FIG. 7, along with the flow chart of FIG. 8, illustrates a method of forming the structures, in accordance with an embodiment of the invention. As in FIG. 3, FIG. 7 illustrates the capacitor 2.

This embodiment is similar to the embodiment described in FIG. 5, except unlike as shown in FIG. 5c, the fifth insulating layer 90 is not deposited. Instead, as illustrated in FIG. 7a, the fourth insulating layer 50 (stabilization layer) is directly deposited over the third insulating layer 40 and the liner 71. The subsequent steps illustrated in FIGS. 7b-7e follow the processes as described with respect to FIGS. 5g-5k. However, because of the absence of the fifth insulating layer 90, the stabilization layer forms a fork shaped structure and hence help to stabilize the underlying first electrode layer 80 during subsequent fabrication.

Figure 9A:
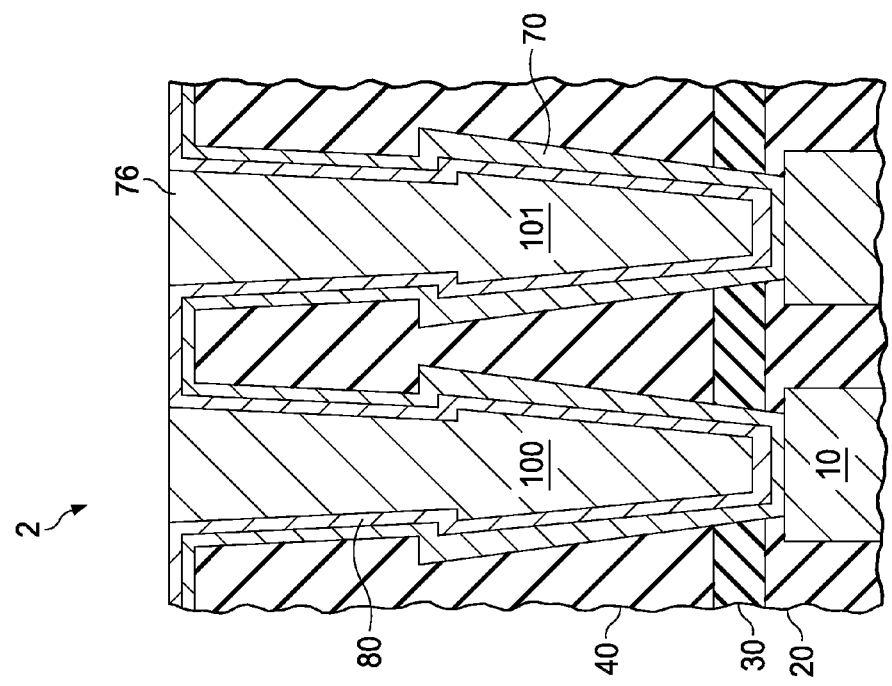
FIGS. 9a-9f, illustrates a stacked capacitor in various stages of fabrication, in accordance with an embodiment of the invention.
Figure 9B:
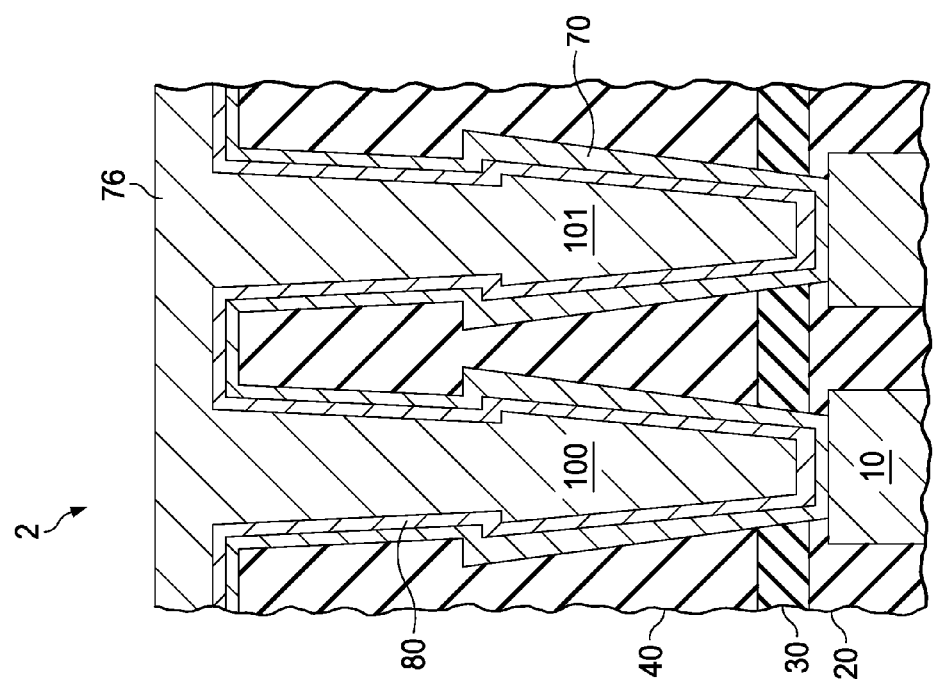
Figure 9C:
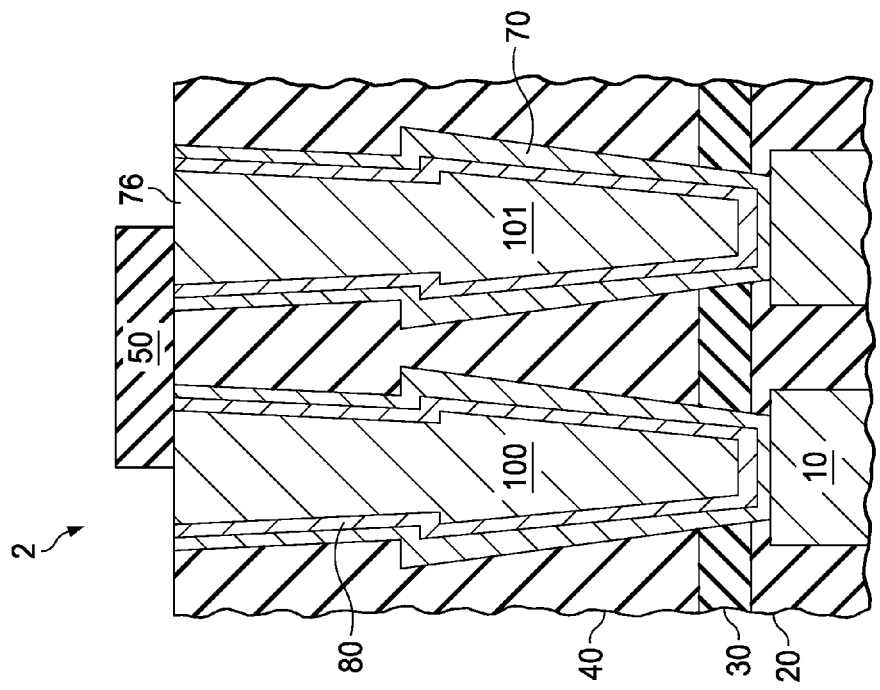
Figure 9D:
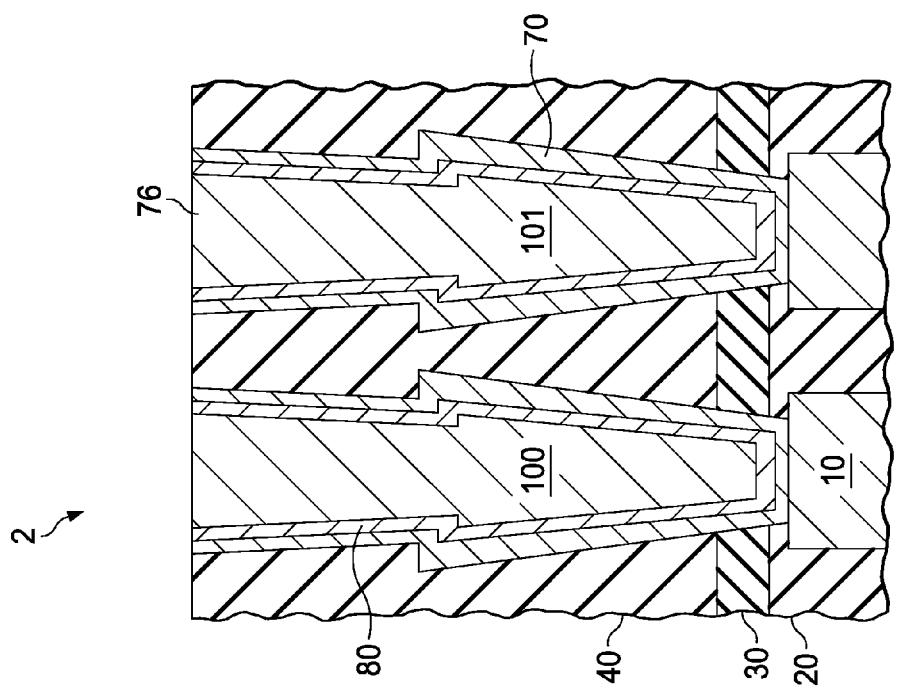
Figure 9F:
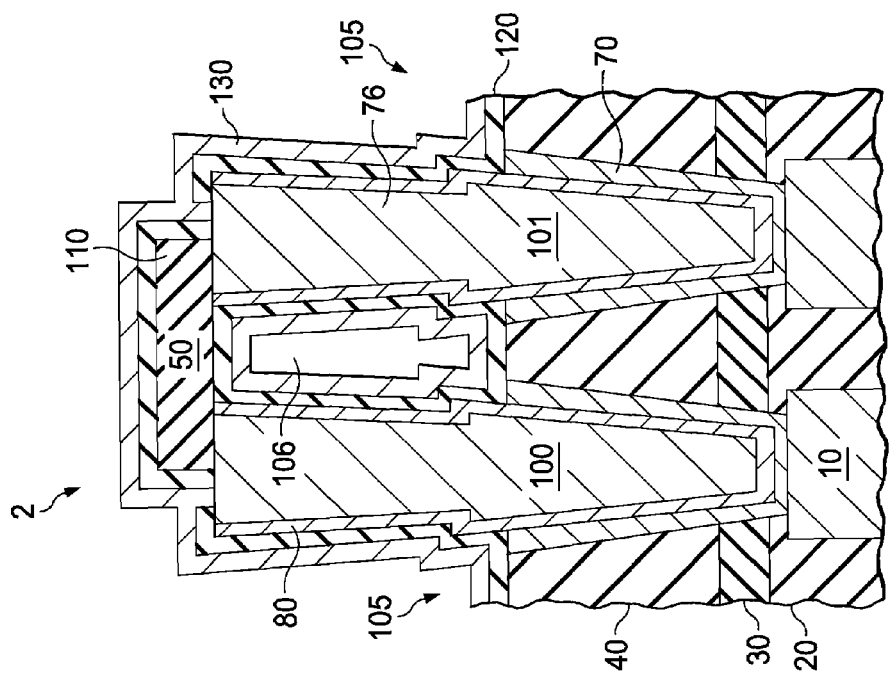
Figure 9E:
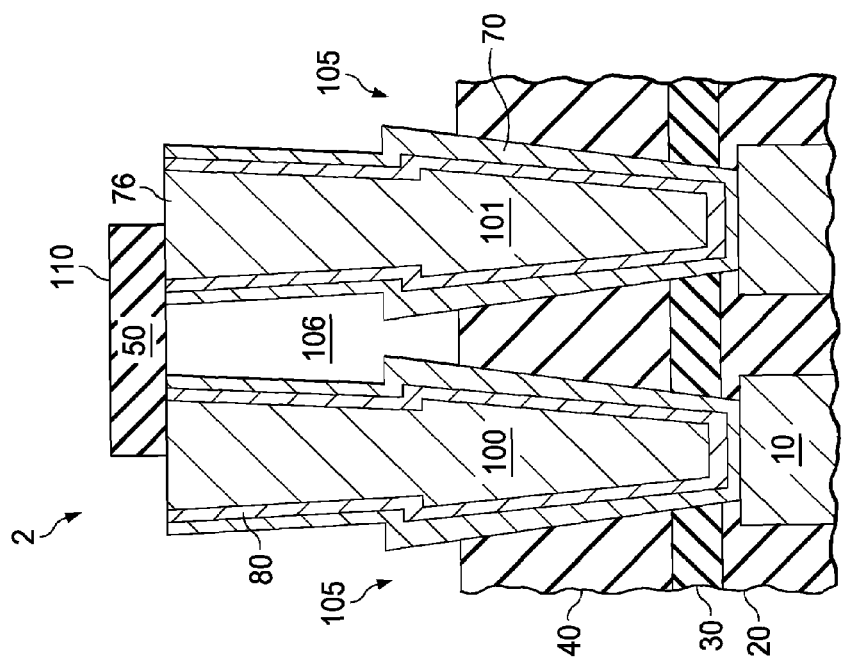
Figure 10:
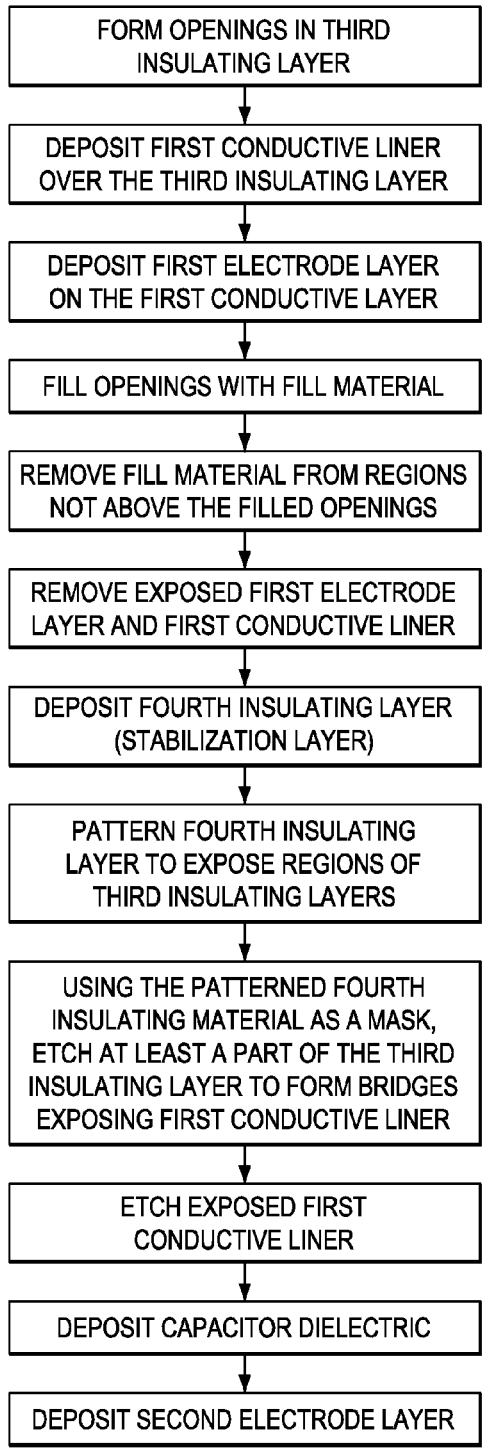
FIG. 10 illustrates a flow chart of a fabrication process used in manufacturing as illustrated in FIG. 9, in accordance with an embodiment of the invention.

FIG. 9, along with the flow chart of FIG. 10, illustrates a method of forming the structures, in accordance with an embodiment of the invention. As in FIG. 3, FIG. 9 illustrates the capacitor 2 areas which comprise the relevant features.

In this embodiment, the first and second openings 100 and 101 are formed as described, for example, in FIG. 5a, and a first conductive liner 70 and first electrode layer 80 are deposited (as described in FIG. 5b). However, the first and second openings are filled with an etch resistant fill material 76.

Examples of the etch resistant fill material 76 include metallic materials as well as nitrides such as SiN, TiN, TaN, etc. The etch resistant fill material 76 etches slower than the third insulating layer 40, and hence is not removed during subsequent processing. Consequently, the first and second openings 100 and 101 can be completely filled as illustrated in FIG. 9a. The etch resistant fill material 76 is planarized, for example, by a CMP process (FIG. 9b). Similar to the embodiment described in FIG. 5d, the first electrode layer 80 and the first conductive liner 70 are removed/planarized. The rest of the processing follows the embodiment described in FIGS. 5d-5k. A fourth insulating layer 50 (stabilization layer) is deposited and patterned (FIG. 9d). As illustrated in FIG. 9e, the outside and inside trench cavities 105 and 106 are formed by etching the third insulating layer 40. FIG. 9f illustrates the structure after forming the capacitor dielectric layer 120 and the second electrode layer 130.

Figure 11A:
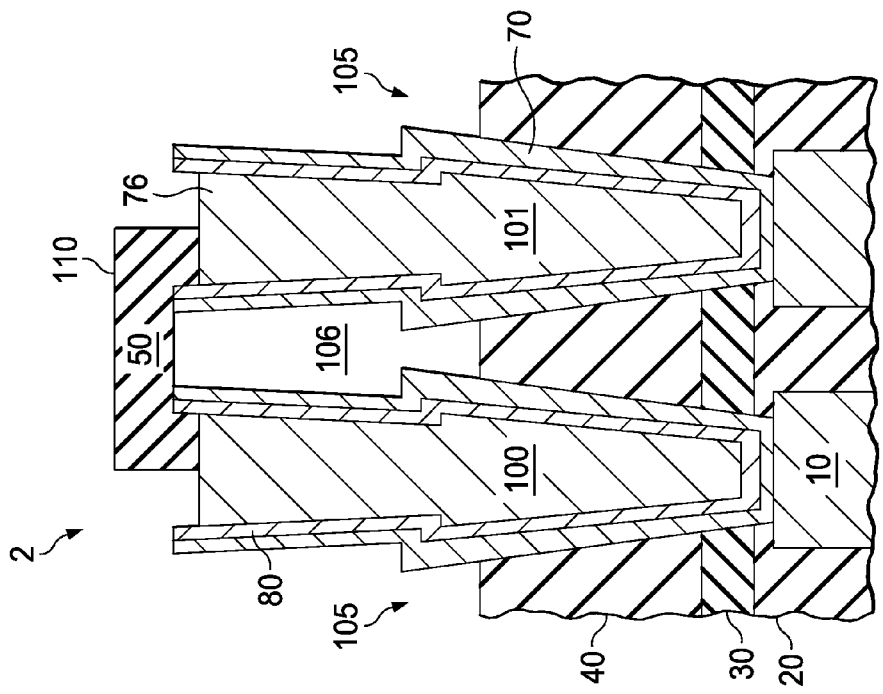
FIGS. 11a-11c, illustrates a stacked capacitor in various stages of fabrication, in accordance with an embodiment of the invention.
Figure 11B:
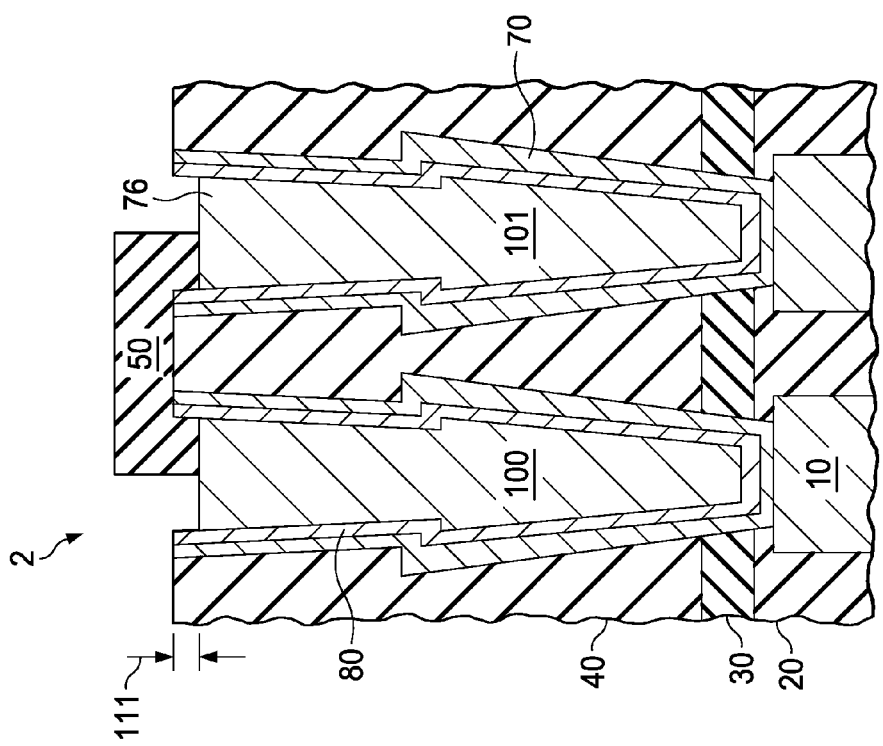
Figure 11C:
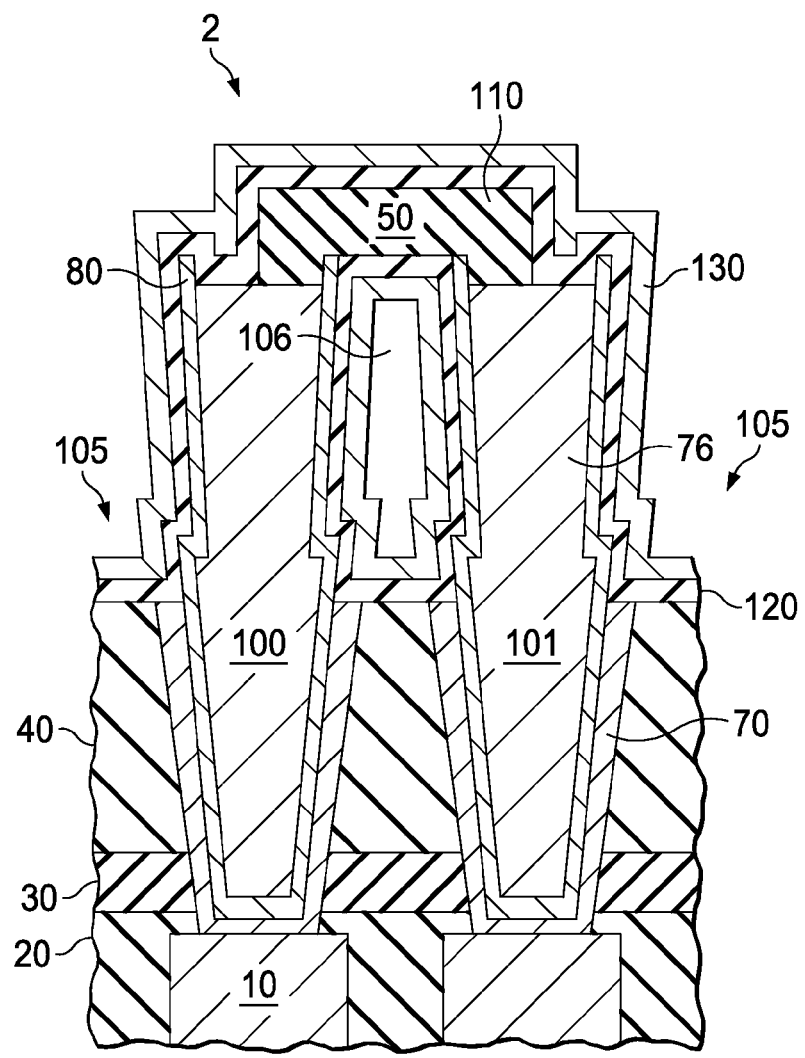
Figure 12:
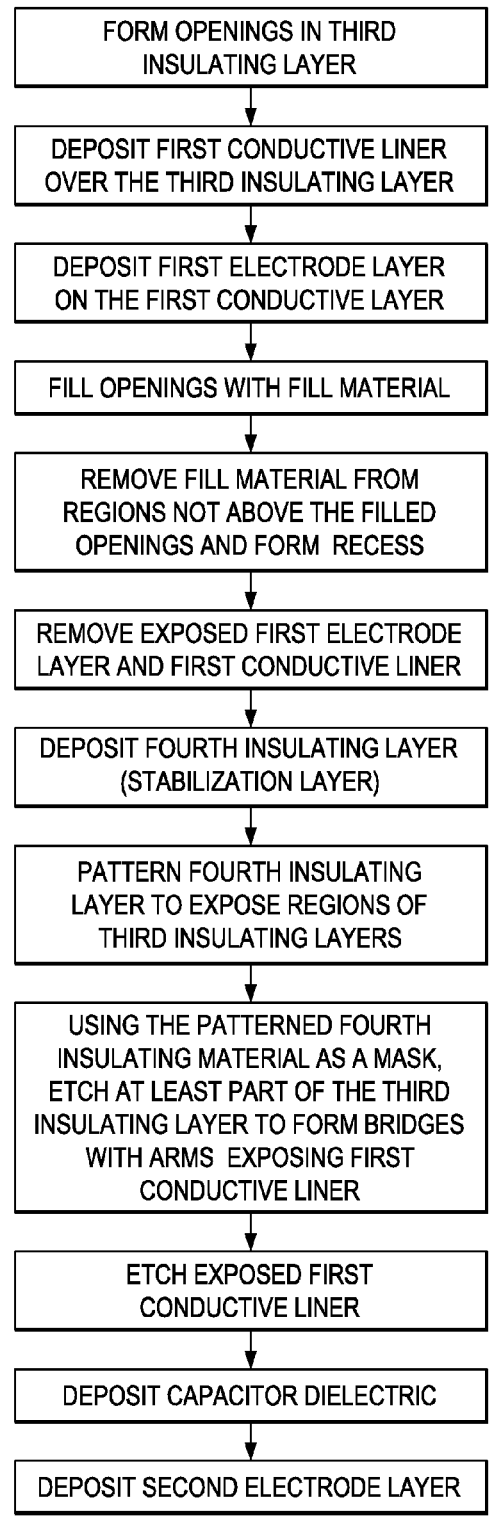
FIG. 12 illustrates a flow chart of a fabrication process used in manufacturing as illustrated in FIG. 11, in accordance with an embodiment of the invention.

FIG. 11, along with the flow chart of FIG. 12, illustrates a method of forming the structures, in accordance with an embodiment of the invention. This embodiment combines the embodiments described in FIGS. 7 and 9.

Referring to FIG. 11a, an etch resistant fill material 76 (similar to FIG. 9) is used to fill the first and second openings 100 and 101. The etch resistant fill material 76 is recessed and a fourth insulating material 50 is deposited, the fourth insulating material fills the recesses 110 (similar to FIG. 7a). Similar, to the embodiments described in FIG. 9e, the outside and inside trench cavities 105 and 106 are formed. The arms or forks of the bridges provide additional mechanical support to the structure during the processing steps that include forming the capacitor dielectric layer 120 and the second electrode layer 130 (FIG. 11c).

Figure 13A:
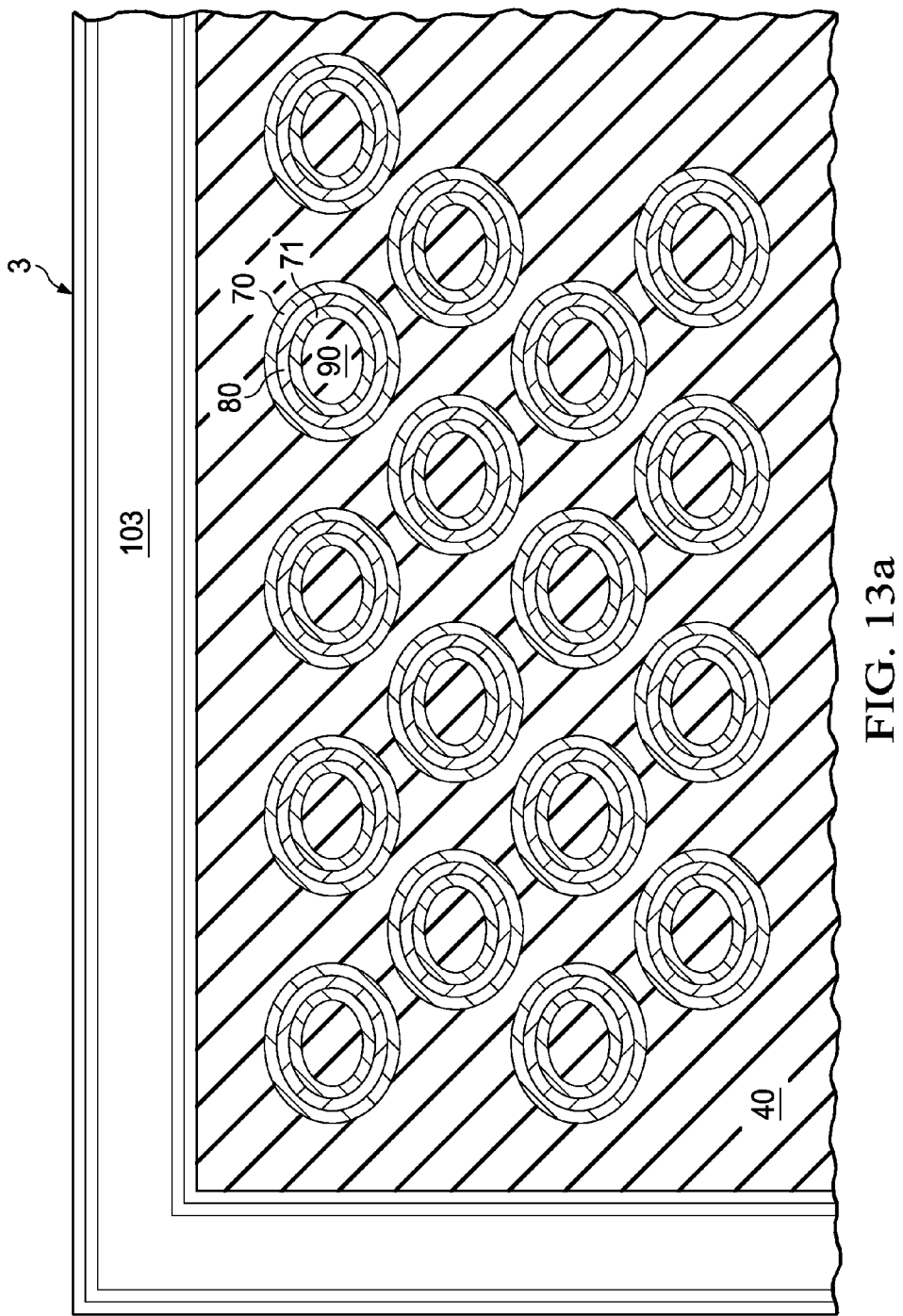
FIGS. 13a-13b, illustrates a top cross section of a stacked capacitor in various stages of fabrication, in accordance with an embodiment of the invention.
Figure 13B:
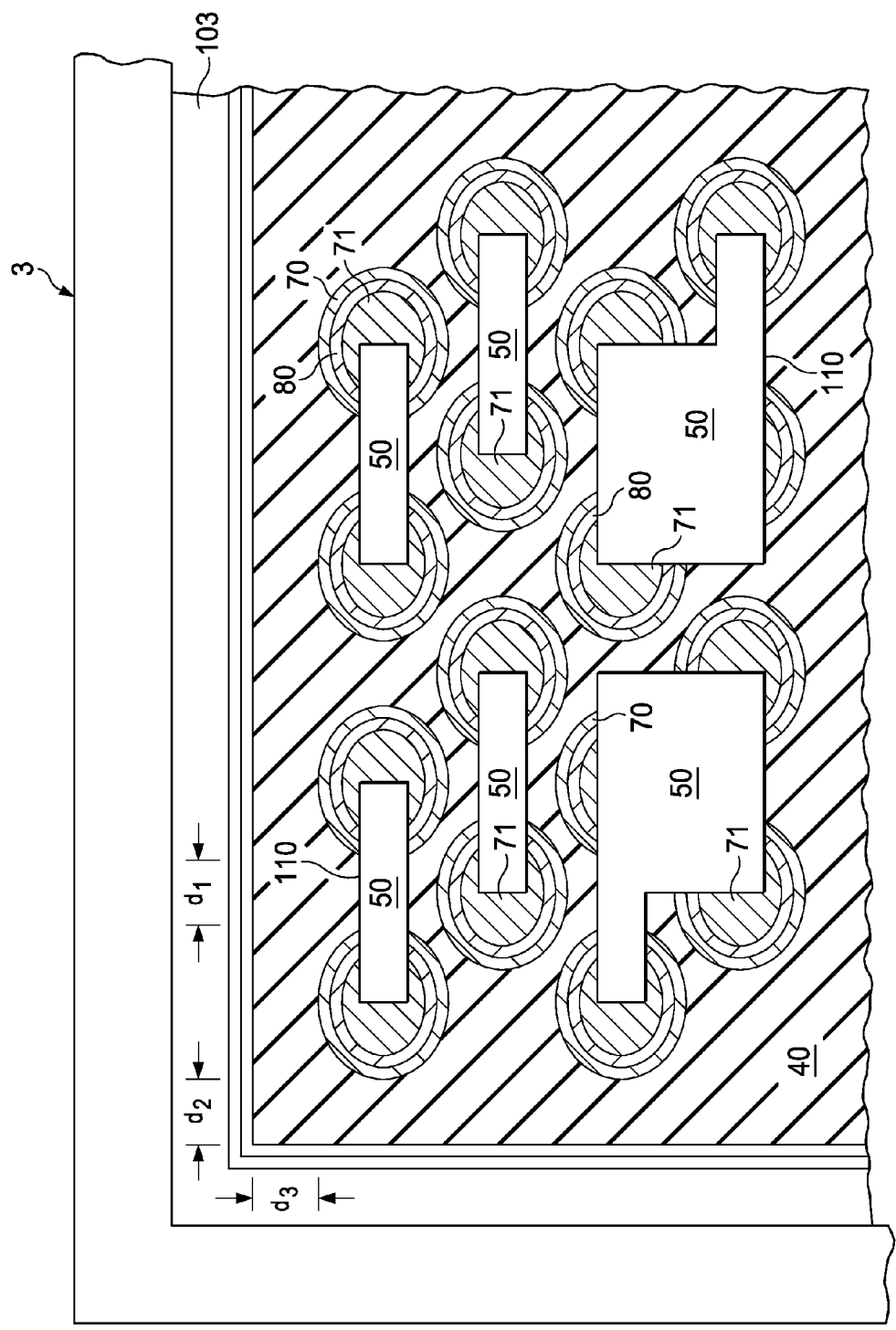

FIG. 13, which includes FIGS. 13a-13b, illustrates a top cross section of the capacitor structures during the fabrication process.

FIG. 13a illustrates the top cross sectional view of a device illustrated in FIG. 5d. However, unlike the top view illustrated in FIG. 5e, FIG. 13a includes additional structures 3 at the edge of the capacitor arrays. The additional structures 3 are formed similar to the first and second openings 100 and 101, but unlike the first and second openings 100 and 101, they are formed from third openings 103. Unlike the cylindrical or oval shape of the first and second openings 100 and 101, the third openings 103 may be trenches that run along the edge of the array of capacitors. The primary function of the third openings 103 is to improve uniformity (e.g., during etch processes) and prevent collapse of the last capacitor structure (e.g., by providing bridge structures).

FIG. 13b illustrates the structures during further fabrication, for example, a top cross sectional view of FIG. 5h. The embodiment illustrates the bridges 110 formed from a patterned fourth insulating layer 50 as described in FIG. 5h. In this embodiment, the patterned fourth insulating layer 50 is formed over the third openings 103. However, the additional structures 3 minimize variations in the amount of the etched third insulating layer 40, thus ensuring uniformity during the etch process. For example, in one embodiment, the lateral distance ($d_2$) of the capacitors to the edge is about the same as the distance between the capacitors ($d_1$). Similarly, in the illustrated embodiment, the vertical distance ($d_3$) of the capacitors to the edge is about the same as the distance between the capacitors ($d_1$). In other embodiments, the lateral and vertical distances $d_2$ and $d_3$ may be independently optimized as a function of distance between the capacitors $d_1$. Similarly, in some embodiments (not shown in FIG. 12b), bridges 110 may be formed (while patterning the fourth insulating layer 50) between the last capacitor and the additional structures 3.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
   a first electrode having an inner portion bounded by a bottom surface and an inner sidewall surface, the first electrode further having an outer sidewall surface, the first electrode being formed from a conductive material, wherein the first electrode comprises a stacked cylindrical structure or a stacked truncated conical or pyramidal structure; and
   a flowable dielectric fill material disposed within the inner portion of the first electrode and directly contacting the first electrode, the fill material comprising an insulating material.

2. The integrated circuit of claim 1, further comprising:
   a capacitor dielectric adjacent at least a portion of the outer sidewall of the first electrode; and
   a second electrode adjacent the outer sidewall of the first electrode and separated therefrom by the capacitor dielectric.

3. The integrated circuit of claim 2, wherein the second electrode is not formed within the inner portion of the first electrode.

4. The integrated circuit of claim 2, wherein the capacitor dielectric is disposed adjacent an upper portion but not a lower portion of the outer sidewall of the first electrode.

5. The integrated circuit of claim 2, wherein the first electrode comprises Ru and the second electrode comprises Ru.

6. The integrated circuit of claim 2, wherein the capacitor dielectric comprises a high-k material.

7. The integrated circuit of claim 1, further comprising a cap layer covering the fill material.

8. The integrated circuit of claim 1, wherein the first electrode comprises a cylindrical electrode, the height of the first electrode being at least 20 times a diameter of the cylindrical first electrode.

9. The integrated circuit of claim 1, wherein the first electric comprises a cylindrical electrode, the diameter of the cylindrical first electrode being smaller than 60 nm.

10. The integrated circuit of claim 1, further comprising a support structure, the support structure comprising:
    a bridge disposed between and in direct contact with the outer sidewall surface of the first electrode and an outer sidewall surface of an adjacent first electrode, wherein the bridge comprises an insulating material different from the fill material.

11. The integrated circuit of claim 1, further comprising a support structure, the support structure comprising:
    a bridge disposed between the first electrode and an adjacent first electrode, and extending above the upper end of first electrode and the adjacent first electrode, wherein the bridge comprises an insulating material different from the fill material.

12. An integrated circuit comprising:
    a semiconductor body;
    a first electrode electrically connected to a region in the semiconductor body, the first electrode extending away from the semiconductor body;
    a fill material at least partially filling and contacting an inner portion of the first electrode, the inner portion bounded by a bottom surface and an inner sidewall surface of the first electrode;
    a capacitor dielectric adjacent a portion of an outer sidewall of the first electrode;
    a second electrode adjacent an upper portion of the outer sidewall of the first electrode and separated therefrom by the capacitor dielectric;
    a bridge disposed between the outer sidewall surface of the first electrode and an outer sidewall surface of an adjacent first electrode, wherein the bridge comprises an insulating material, and
    an inside trench cavity disposed under the bridge and disposed between the outer sidewall surface of the first electrode and the outer sidewall surface of the adjacent first electrode.

13. The integrated circuit of claim 12, further comprising an interlevel dielectric overlying the semiconductor body and surrounding a lower portion of the first electrode.

14. The integrated circuit of claim 13, wherein the bridge overlies the interlevel dielectric.

15. The integrated circuit of claim 12, wherein the second electrode is not formed within the inner portion of the first electrode.

16. The integrated circuit of claim 12, further comprising a cap layer covering the fill material.

17. The integrated circuit of claim 16, wherein the cap layer is formed at a level below an upper surface of the first electrode.

18. The integrated circuit of claim 12, wherein the first electrode comprises Ru, the second electrode comprises Ru and the capacitor dielectric comprises a high-k dielectric.

19. The integrated circuit of claim 13, further comprising a seed layer between the interlevel dielectric and the first electrode.

20. The integrated circuit of claim 12, wherein the bridge is disposed above a top surface of the fill material.

21. The integrated circuit of claim 12, wherein the bridge comprises silicon nitride.

22. An integrated circuit comprising:
    a semiconductor body;
    a first electrode electrically connected to a region in the semiconductor body, the first electrode extending away from the semiconductor body and comprising a stacked cylindrical, conical, or pyramidal structure;
    an adjacent first electrode substantially similar to the first electrode and disposed adjacent the first electrode;
    a fill material at least partially filling and contacting an inner portion of the first electrode and the adjacent first electrode, the inner portion bounded by a bottom surface and an inner sidewall surface of the first electrode and the adjacent first electrode;
    a capacitor dielectric adjacent a portion of an outer sidewall of the first electrode and the adjacent first electrode;

a second electrode adjacent an upper portion of the outer sidewall of the first electrode and the adjacent first electrode, and separated therefrom by the capacitor dielectric;

a bridge disposed between the outer sidewall surface of the first electrode and an outer sidewall surface of the adjacent first electrode, wherein the bridge comprises an insulating material; and an inside trench cavity disposed under the bridge, and disposed between the outer sidewall surface of the first electrode and the outer sidewall surface of the adjacent first electrode.

23. The integrated circuit of claim 22, further comprising an interlevel dielectric overlying the semiconductor body and surrounding a lower portion of the first electrode.

24. The integrated circuit of claim 23, wherein the bridge overlies the interlevel dielectric.

25. The integrated circuit of claim 22, wherein the second electrode is not formed within the inner portion of the first electrode and the adjacent first electrode.

26. The integrated circuit of claim 22, further comprising a cap layer covering the fill material.

27. The integrated circuit of claim 26, wherein the cap layer is formed at a level below an upper surface of the first electrode and the adjacent first electrode.

28. The integrated circuit of claim 22, wherein the first electrode and the adjacent first electrode comprise Ru, and wherein the second electrode comprises Ru and the capacitor dielectric comprises a high-k dielectric.

29. The integrated circuit of claim 22, wherein the bridge is disposed above a top surface of the fill material.

* * * * *